United States Patent [19]

Minami

[11] Patent Number: 5,410,491

[45] Date of Patent: Apr. 25, 1995

[54] METHOD FOR DISTRIBUTING A CLOCK SIGNAL WITHIN A SEMICONDUCTOR INTEGRATED CIRCUIT BY MINIMIZING CLOCK SKEW

[75] Inventor: Fumihiro Minami, Tokyo, Japan

[73] Assignee: Kabushiki Kaisha Toshiba, Kawasaki, Japan

[21] Appl. No.: 896,618

[22] Filed: Jun. 10, 1992

[30] Foreign Application Priority Data

Jun. 10, 1991 [JP] Japan .................................. 3-137851
Nov. 14, 1991 [JP] Japan .................................. 3-299104

[51] Int. Cl.[6] .............................................. G06F 15/46
[52] U.S. Cl. ..................................... 364/491; 364/489
[58] Field of Search ......................... 364/489, 490, 491

[56] References Cited

U.S. PATENT DOCUMENTS

| | | | |
|---|---|---|---|
| 4,811,237 | 3/1989 | Putatunda et al. | 364/491 |
| 4,815,003 | 3/1989 | Putatunda et al. | 364/491 |
| 5,077,676 | 12/1991 | Johnson et al. | 364/489 |
| 5,218,551 | 6/1993 | Agrawal et al. | 364/491 |
| 5,262,959 | 11/1993 | Chkoreff | 364/489 |

FOREIGN PATENT DOCUMENTS

| | | |
|---|---|---|
| 61-82455 | 4/1986 | Japan . |
| 63-107316 | 5/1988 | Japan . |
| 1-157115 | 6/1989 | Japan . |

OTHER PUBLICATIONS

Jackson et al., "Clock-Routing for High-Performance ICs", ACM/IEEE Design Automation Conference, Jun. 24, 1990, pp. 573-579.

Boon et al., "High Performance Clock Distribution for CMOS ASICs", IEEE Custom Integrated Circuits Conference, 1989, pp. 15.4.1-15.4.5.

H. B. Bakoglu et al., "A Symmetric Clock-Distribution Tree and Optimized High-Speed Interconnections for Reduced Clock Skew in ULSI and WSI Circuits", IEEE 1986, pp. 118-122.

*Primary Examiner*—Kevin J. Teska
*Assistant Examiner*—Susan Wieland
*Attorney, Agent, or Firm*—Foley & Lardner

[57] ABSTRACT

A clock-signal distributing method used in a wiring-pattern network such that a clock signal is supplied from root driver cells via repeating buffer cells to terminal cells. The method comprises the steps of: grouping the terminal cells into clusters containing at least one of the terminal cells, forming a binary-tree-shaped wiring pattern path where the root driver cells are root nodes and the clusters are leaf nodes, inserting the repeating buffer cells into the wiring pattern path at which delay time required for clock signal transmission in the binary-tree-shaped path is minimized, calculating first delay amounts in a signal path defined from a branch node at a low level of the binary-tree-shaped path to the leaf nodes, setting physical positions of the branch nodes such that a difference among the calculated first delay amounts is minimized, separating the overlapped terminal cells from each other on the binary-tree-shaped path by updating previous information about a circuit connection when the repeating buffer cells are inserted and by correcting arrangement information about terminal cell positions adjacent to the buffer cells, determining a final wiring-pattern path within each of the clusters based upon the corrected arrangement information, calculating second delay amounts in the clusters based on the finally determined wiring-pattern path, determining respective branch node positions based on the second delay amounts, and determining a final wiring-pattern path among the branch nodes.

12 Claims, 13 Drawing Sheets

LEAF NODE 28

METHOD FOR DISTRIBUTING A CLOCK SIGNAL WITHIN A SEMICONDUCTOR INTEGRATED CIRCUIT BY MINIMIZING CLOCK SKEW

BACKGROUND OF THE INVENTION

1. Field of the Invention

The present invention generally relates to a method for distributing a clock signal within a semiconductor integrated circuit in a computer-aided design (CAD). More specifically, the present invention is directed to a clock signal distributing method used in a layout of a logic digital integrated circuit by minimizing a clock skew caused by various delays of the digital logic integrated circuit.

2. Description of the Prior Art

Generally speaking, sequential circuits such as flip-flop circuits are employed in a digital logic integrated circuit, and an overall circuit is operated in synchronism with a plurality of clock signals having different phases and periods with respect to each other. Clock signals are produced within an integrated circuit chip, or are supplied thereto from an external device. These clock signals are normally supplied via several staged buffer cells to circuit blocks of this logic digital integrated circuit. In general, buffer cells are automatically connected with each other, and also buffer cells are automatically connected with flip-flops by way of the CAD (computer-aided design) technique.

As is known in the art, there are certain differences in delay time when a clock signal is transferred to each of flip-flop circuits, namely, phase differences among the clock signals. The phase differences are so-called as "clock skew". If the clock skew becomes too great, then the circuit can no longer operate in synchronism with a clock signal having a desirable clock frequency. In other words, the synchronizing operation of this circuit can no longer be maintained at the desirable clock frequency. As a consequence, it is required in an IC chip design to determine positions and wiring paths (route) of buffer cells employed therein in order that clock signals come to all of flip-flops formed on this IC chip at substantially same timings.

There are essentially two typical wiring delays to flip-flops: internal delays of repeating buffer cells, and delays occurring when wiring capacitances/resistances of wiring patterns and input terminal capacitances of cells to be driven are charged/discharged by the buffer cells.

With respect to the wire resistances, since sizes of transistors and sectional areas of wiring patterns can be considerably reduced by utilizing the latest semiconductor fine processing techniques, these resistance values are no longer negligible. Accordingly, such a large-scale integration circuit should be handled as a distributed RC network in order to improve prediction of delay times. For instance, a circuit as shown in FIG. 1A should be considered as a distributed RC network as represented in FIG. 1B (will be described in a preferred embodiment).

Then, there are two typical conventional clock-skew reducing methods, for instance, the mesh method and the tree method.

The first-mentioned mesh method has been described in, for instance, Japanese Patent Disclosure No. 63-107316 (1988), in which wiring paths routing chips are formed in a mesh shape, buffer cells are connected adjacent to the wiring paths, and flip-flops are connected to the buffer cells.

This mesh method has the following merits. The structure is simple. Since the wiring path is shaped as a ring form, equivalent resistances of the wiring patterns are lowered, resulting in small delays. Delays can be predicted before the layout process. However, in case of an integration circuit having very large scale, there are problems that clock skew between one flip-flop positioned near a root driver and another flip-flop positioned far from this root driver is no longer negligible, and also since the entire circuit must be segmented by very small meshes, the total wiring length is considerably increased.

On the other hand, in the tree method, buffer cells are connected in parallel with each other at each stage, to constitute a multistage structure, in which tree-shaped wiring paths are formed. The conventional insertion techniques of the buffer cells are described in, for example, Japanese Patent Disclosure No. 61-82455 (1986) and No. 1-157115 (1990). Also, the tree-shaped wiring path techniques are known from, for example, the H-tree shape of H. B. Backoglu, et al.: "A symmetric clock-distribution tree and optimized high-speed interconnections for reduced clock skew in ulsi and wsi circuits.", IEEE Int. Conf. on Computer Design, 1986.

This conventional tree method has such an advantage that the clock skew can be reduced and this tree method may be readily applied to design semiconductor IC chips having large memory capacities, for instance, so-called "large macro cells" such as ALU and RAM. To the contrary, this tree method has the following drawbacks. When the stage number of buffer cells becomes large, then large delays are caused even though the clock skew may be reduced. Also, it is difficult to predict delays unless a detailed layout process is executed.

As previously explained, although either method has the above-described merits and demerits, the tree method is preferable to designate a large-scaled integrated circuit. Accordingly, a more detailed explanation will be made of the conventional tree method.

The "H-tree" method known as the typical wiring form of the tree method, is such that the H-shaped wiring paths are repeated while being recursively compared and reduced, and equilength or equidistance and equidelay can be maintained in the wiring patterns due to the symmetric shape thereof. However, the above-described delays cannot be achieved unless the total number of elements or element groups is equal to a power of 2, and at the same time, the capacitances of the elements are equal to each other with a symmetrical element arrangement. As a consequence, this H-tree method having such severe conditions may not be practically utilized in the actual circuit design.

To improve this H-tree method, there is the MMM algorithm as described in, Michael A. B. Jackson, et al.: Clock Routing for High-Performance ICs., 27th ACM-/IEEE Design Automation Conf., 1990. This conventional method is such that while flip-flops or buffer cells are split in equal number from a top stage to a bottom stage, branch points or junctions of wiring paths are set to gravity positions of the flip-flops positioned within the split regions. Although the process of this tree method is rather simple, the clock skew can be relatively reduced. However, since the tree process is carried out from the top stage to the bottom stage, there is a drawback that a satisfactory skew value may not be obtained, depending upon the precision of delay time prediction.

Furthermore, there is one conventional method to insert buffer cells under optimum condition, i.e., S. Boon, et al.: High performance clock distribution for cmos asic's., IEEE Custom Integrated Circuit Conf., 1989. However, there is a problem that since the wiring method per se has the same algorithm as being used in the normal signal, the large clock skew is caused by differences in the wiring resistances for the respective signal paths when the region to be wired is wide.

As previously stated, in accordance with these conventional methods for distributing the clock signals by the tree methods, although these methods have the same objects, namely reduce the clock skew, the decisions on insertion of the buffer cells and the wiring paths are separately performed with respect to each other. Moreover, as the wiring paths are not determined based upon the detailed delay assumption, very fine balanced clock skew cannot be achieved.

SUMMARY OF THE INVENTION

The present invention has been made in an attempt to solve the above-described problems, and has an object to provide a novel method for distributing a clock signal, capable of extremely lowering clock skew in designing a semiconductor digital integrated circuit.

Another object of the present invention is to provide such a clock signal distributing method capable of combining both of a process to insert buffer cells and a process to determine wiring paths, while branch points or junctions of the wiring paths are defined based upon precise delay-predicted values.

A further object of the present invention is to provide a clock signal distributing method capable of designing any semiconductor digital integrated circuits having uniform element positions and also discrepant (unbalanced) element positions.

To achieve the above-described objects, a method for distributing a clock signal, according to the present invention, in a wiring-pattern network formed on a semiconductor substrate in such a manner that said clock signal is supplied from root driver cells via repeating buffer cells to a plurality of terminal cells; comprises the steps of:

grouping said plurality of terminal cells into a plurality of clusters containing at least one of said terminal cells;

forming a binary-tree-shaped wiring pattern path where said root driver cells are constituted as root nodes and said clusters are constituted as leaf nodes;

inserting said repeating buffer cells into portions of the wiring pattern path at which delay time required for transmitting said clock signal in the binary-tree-shaped path is minimized;

calculating first amounts of delays appearing from the respective branch nodes to the leaf nodes, said calculating step being successively repeated from a node positioned at a low level of said binary-tree shaped path to said root nodes;

setting physical positions of said branch nodes on the semiconductor substrate in such a manner that a difference among said calculated first delay amounts becomes minimum;

separating said terminal cells from each other which are overlapped with each other on said binary-tree-shaped path by updating previous entire information about a circuit connection when said repeating buffer cells are inserted, and by correcting arrangement information about positions of the terminal cells adjacent to said buffer cells;

determining a final wiring-pattern path within each of said clusters based upon said corrected arrangement information;

calculating second delay amounts occurring in the clusters based on the finally determined wiring-pattern path;

determining positions of the respective branch nodes based on said second delay amounts; and determining a final wiring-pattern path among said branch nodes.

A clock-signal distributing method as described above, wherein said first delay amounts are defined by resistance values and capacitance values of said signal path from said branch node at the low level of said binary-tree-shaped path to said leaf nodes.

In accordance with one aspect of the clock signal distributing method according to the present invention, with respect to terminal cells such as flip-flops within a semiconductor chip, which will receive the clock signal, a plurality of cells positioned near the terminal cells are grouped as a "cluster", and the wiring paths or conductors within the cluster are designed based upon the algorithm to determine wiring paths for the normal signal. Then, the "binary-tree" wiring patterns are formed from the root driver cells to the clusters. In this case, a size of each cluster owns an upper limit value in order that delay time caused by wire resistances appearing within this cluster does not become large, and also the clustering process is carried out in such a manner that the load capacitances appearing in the cluster become uniform.

Also, according to another aspect of the present invention, a plurality of buffer cells for the repeating purpose may be automatically inserted into such entry portions of clusters and also circuit portions within a binary tree where delays become minimum, and then a multistaged hierarchical structure of sub-trees in which either root driver cells or repeating buffer cells are positioned employed as starting points, may be formed.

The positions of the branch nodes within the respective sub-trees are set to such places where differences between RC (caused by resistances and capacitances) delays caused after two child nodes of these sub-trees become minimum values. This design process is repeated from the bottom position to the top position, thereby determining the wiring patterns of the sub-trees. Furthermore, in the stage to fabricate the shapes of the wiring patterns of the sub-trees, the positions of the binary trees are slightly adjusted in such a manner that delays caused in the sub-trees having the same hierarchical structures become uniform, or are equal to each other.

DETAILED DESCRIPTION OF PREFERRED EMBODIMENTS

Distributed RC Network

Figure 1A:
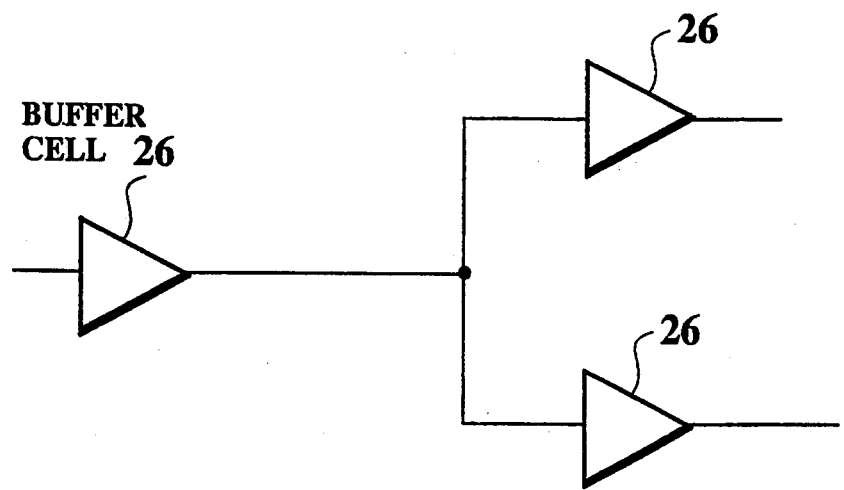
FIGS. 1A and 1B show circuit diagrams used to explain the inventive idea (distributed RC network) of the present invention.
Figure 1B:
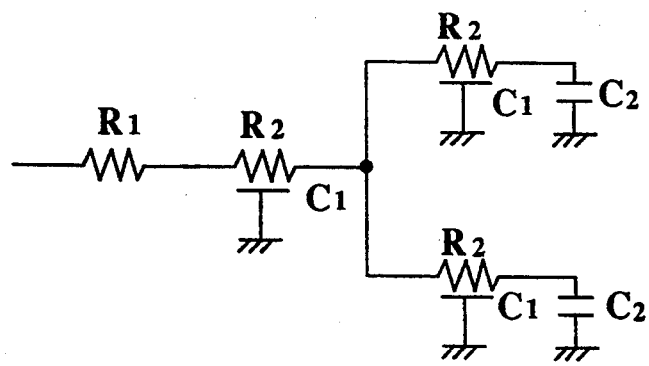

As previously described, in accordance with the present invention, prediction of delay times, or clock skew can be considerably reduced by handling such a buffer cell circuit shown in FIG. 1A as a distributed RC network indicated in FIG. 1B (will be discussed in more detail).

Overall Process to Distribute Clock Signal

Referring now to a flow chart of FIG. 2, an overall process to distribute a clock signal within a semiconductor digital integrated circuit (not shown in detail), according to a first preferred embodiment of the present invention will be described.

Roughly speaking, the clock signal distribution process of the first preferred embodiment may be subdivided into 4 subprocesses. That is, an input process of specification data (as defined at a step ST-1); a provisional decision process of a tree branch point (as defined from a step ST-2 to a step ST-5); an engineering change process (as defined from a step ST-6 to a step ST-7); and a decision process of an actual wiring path (as defined from a step ST-8 to a step ST-11). It should be noted that the above-described distribution process is carried out after the cell arranging positions have been determined, and also before the wiring paths for the normal signals are determined.

Figure 2:
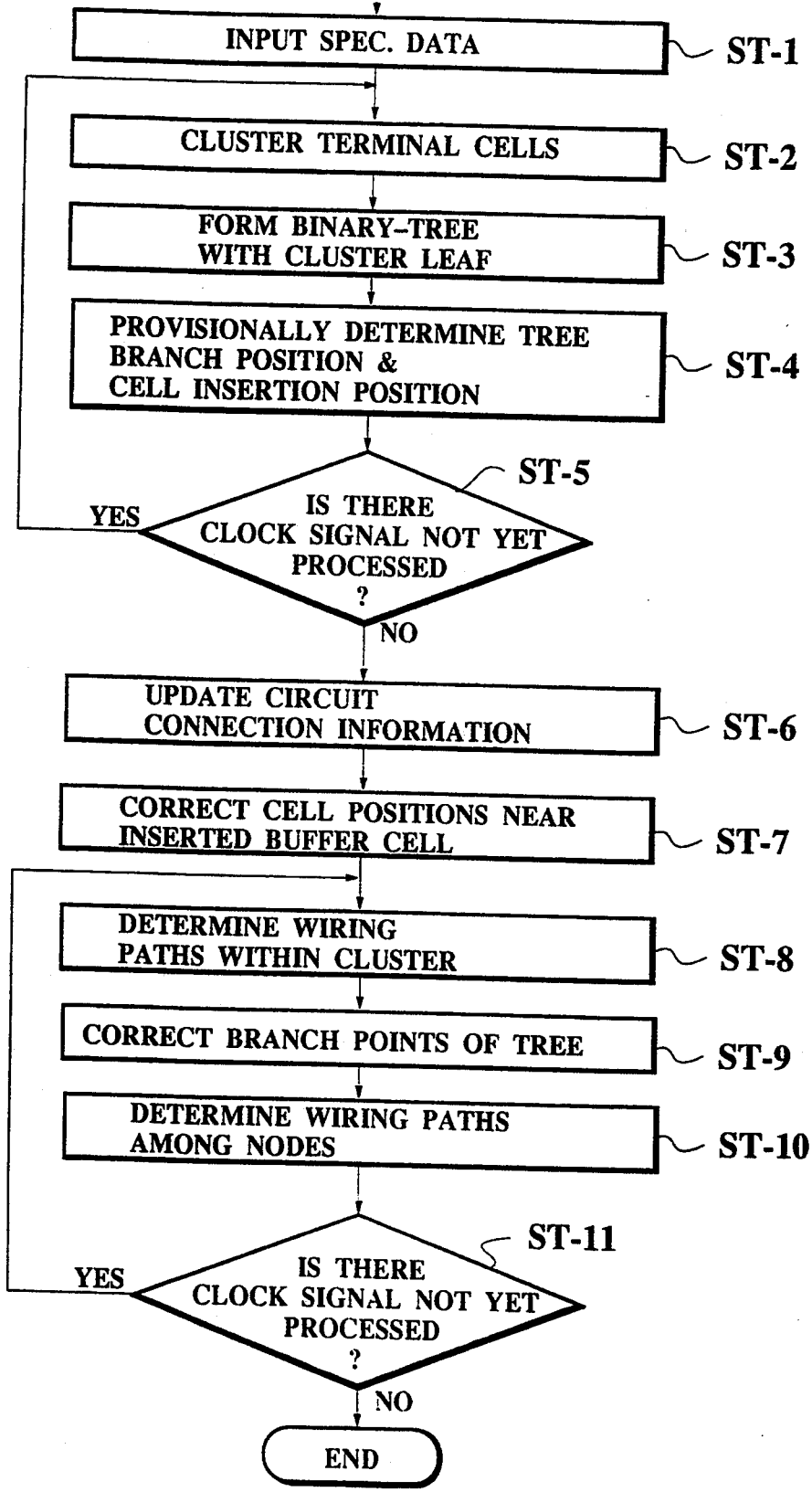
FIG. 2 is a flow chart for explaining an overall process of the clock signal distributing method according to a first preferred embodiment of the present invention.

In the clock signal distributing process of the first preferred embodiment as shown in the flow chart of FIG. 2, first, data on the following specification are inputted at a step ST-1. The specification data imply names of clock signals inputted into root driver cells; the number of buffer cell stages to be inserted; sorts of buffer cells to be employed; and target values of delays and clock skew.

At a next step ST-2, driven cells such as flip-flops (will be referred to as "terminal cells") are clustered for each of the designated clock signals (i.e., a clustering process). When producing such clusters, the region where the terminal cells are present is subdivided in a mesh form; an initial setting operation is performed that the terminal cells arranged within the subdivided (meshed) region belong to the same cluster; subsequently, the terminal cells belonging to the adjoining clusters are moved and substituted with each other in such a manner that a summation of a wiring capacitance and an input pin capacitance becomes uniform. The wiring capacitance is calculated from the predicted wiring pattern length within the cluster, whereas the input load capacitance is calculated from the terminal cells. A size of a meshed region is settable under such conditions that the load capacitance existing in the cluster is limited to a driving range of buffer cells to be driven, and furthermore to a range where the delay effects caused by the wiring resistances are not so large. Assuming now that a length of one side of a mesh is "l", a resistance value of a wiring pattern per a unit is "r"; and an ON-resistance of a buffer cell is "$R_o$", this allowable range "rl" is equal to, or smaller than 0.05 $R_o$ (namely, approximately 5%).

At a step ST-3, an entire binary tree is formed in which only a parents/children relationship containing the clusters as leaf nodes is represented. That is, a process to subdivide the leaf node into two parts at each of the nodes of the binary tree, is recursively repeated for the root node (root driver cell) up to a child node thereof. It should be noted that when the leaf node is divided into two parts, differences among the quantities of the respective leaf nodes should be limited to within 1, and eventually differences in the depth levels (namely, hierarchical levels) of the respective leaf nodes from the root node must be limited to within 1 level. The hierarchical levels of the binary tree have been previously determined in accordance with the allowable delays.

At a next step ST-4, physical positions of the respective nodes other than the root node and the leaf nodes are provisionally determined in the binary tree defined at the previous step ST-3. These provisionally determined node positions will become branch points, or junctions used when the wiring paths are determined, and these node positions are set in such a manner that delay differences occurring after the branch points are minimized. At this time, it is assumed that the position of the leaf node is located at a center of the corresponding cluster. In addition thereto, the repeating buffer cells are inserted into the provisionally determined physical positions of the tree nodes based upon the inputted specification data at a step ST-4. In this case, both of the depths with respect to the overall binary tree, and the sorts of cells are identical to each other for the respective insertion stages of the buffer cells.

In a judgement process at the next step ST-5, a check is made whether or not the clock signals which have not yet been processed from the steps ST-2 to ST-4, are still left. If YES, then the process operations as defined from the step ST-2 to ST-4 are performed with respect to the remaining clock signals. Conversely, if NO, then the process operation is advanced to a step ST-6.

At this step ST-6, the circuit connection information which has been varied by inserting the buffer cells is updated. That is, a level net and a connection terminal thereof are added, and the connection net of the connection terminal for the old clock net is updated at this step ST-6.

Then, at a step ST-7, the positions of the cells located near the inserted buffer cells are corrected in such a manner that if there is such a pattern located near the inserted buffer cell, which is overlapped with this buffer cell, this overlapped pattern is removed. As described above, the positions of the cells are precisely rearranged in such a manner that the position of the inserted buffer cell must be close to the position of the branch point determined at the previous step ST-4, into which this buffer cell should be inserted.

Then, at a step ST-8, the actual wiring paths within the cluster are determined based upon the algorithm for defining wiring paths used to the normal signal in such a way that the length of the wiring paths can be shortened as much as possible.

At the next step ST-9, the positions of the branch points for the binary tree are corrected. This correction is to correct the positions of the branch points so as to establish the precise delay balance in accordance with definitions of the wiring capacitances within the cluster. This positional determination is similar to that of the step ST-4.

At a step ST-10, the actual wiring paths among the nodes of the binary tree are determined. Basically, the nodes located on the binary tree and having the parents/children relationship with each other are connected to each other via the shortest path.

Thereafter, in a Judgement process at a step ST-11, a check is done whether or not the clock signal for which the actual wiring path has not yet been determined is still present. If YES, then the process operations as defined from the step ST-8 to the step ST-10 are repeated for the remaining clock signals. To the contrary, if NO, then all of the overall process operations have been accomplished.

Binary-Tree Forming Process

Referring now to a flow chart of FIG. 3, the binary-tree forming process as defined at the previous step ST-4 will be described in more detail.

At a first step ST-12, both of the sorts of buffer cells to be inserted, and also the insertion levels thereof (namely, depths in the entire binary tree) are set for each of the insertion stages. The sorts of buffer cells are available within the range designated by the above described specification data, whereas an upper limit level of the insertion levels is equal to the depth up to the leaf node. Furthermore, the same sort of buffer cells are inserted into the physical positions at the same level.

At the subsequent step ST-18, the buffer cells are inserted into the physical positions of the entire binary tree under conditions set at the preceding step ST-12, whereby a hierarchical tree is formed.

At a step ST-14, the positions of the branch points are determined, and also the delays caused from the branch points to the leaf nodes are calculated. The position of the branch point is determined in such a manner that a summation between delays caused by the wire resistances of the wiring patterns positioned at levels below than this position of the branch point, and also delays caused by the buffer cells after this branch point, is calculated every two children nodes, and furthermore, a difference between these delays is cancelled by another difference caused by the wire resistances from this branch point to the children nodes (will be discussed later). Such a branch-point determining operation is executed from the leaf nodes of the entire tree toward the root nodes, i.e., from the bottom to the top of this binary tree.

At a step ST-15, it is judged whether or not the clock skew/delay from the present root node to the leaf node can satisfy the specification. Otherwise, a check is made whether or not this delay value is equal to the minimum delay value. If the optimum value, namely the minimum delay value can be obtained from the previous calculation results, the process operation is advanced to the next step ST-16. Conversely, if an unsatisfactory delay value is obtained, the process operation is jumped to a step ST-17.

At the step ST-16, assuming now that both of the tree structure and the delay value obtained at this time correspond to the best data, this best data is stored. If there are data previously stored therein, these old data are substituted by the above-described best data.

A Judgement is made at the step ST-17 whether or not there is any combination between the sort and the insertion level of the buffer cell which has not yet been processed. If YES, then the process operation is advanced to a step ST-18. To the contrary, if NO, then a series of process operation as defined from the step ST-12 to the step ST-18 is completed.

At the step ST-18, the data about the buffer cells which have been inserted into the structure of the present tree data, are deleted, so that the state where the buffer cell has not yet been inserted is recovered. Subsequently, the process operation is returned to the previous step ST-12 in order to set different sorts of buffer cells and insertion levels.

Process for Determining Branch Point Position

The methods for determining positions of branch points at the step ST-14 (see FIG. 3) will now be described in more detail with reference to a flow chart shown in FIG. 4. The following methods are explained in such a manner that after a delay calculation model required to determine positions has been explained, a method for determining positions of branch points within a single sub-tree is first described, and finally, another method for the overall binary tree is explained.

(1) Delay Calculation Model

Figure 5:
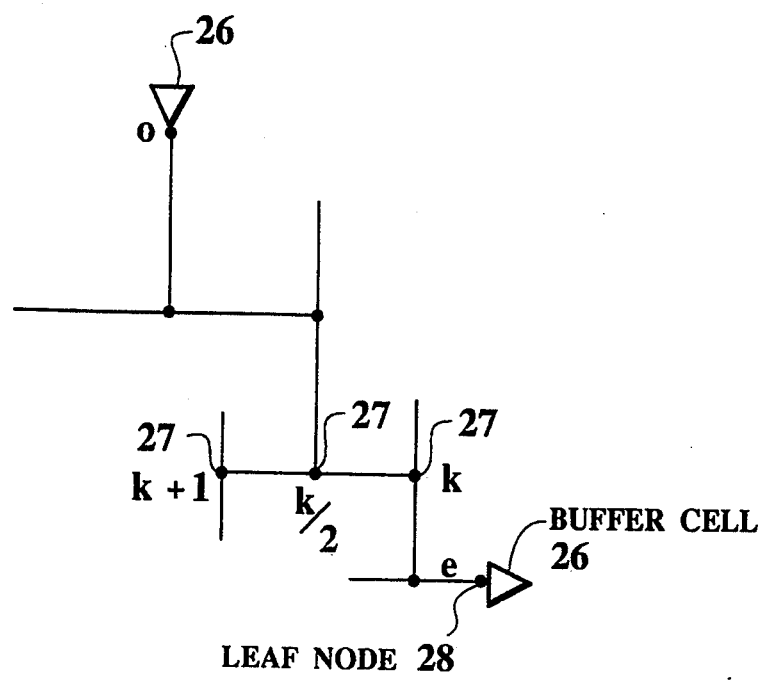
FIG. 5 schematically illustrate an example of sub-tree structure according to the first preferred embodiment.

In this embodiment, a description will now be made of delay calculations within a single sub-tree. That is, a delay calculation is performed with respect to delays from an input terminal of a root driver cell (buffer cell) to an input terminal of a buffer cell at the next stage. For the sake of simple explanation, it should be understood that a first branch point on this single sub-tree is defined as a node number 1; when symbol "k" indicates an even number, two children node numbers for a branch point of a node number k/2 are equal to "k" and "k+1"; and when symbol "k" denotes an odd number, two children node numbers for a branch point of a node number k/2 are equal to "k" and "k−1" (see FIG. 5). Also, it is expanded and set such that node numbers for an input terminal of a root driver cell and also an output terminal thereof are equal to "−1" and "0", respectively.

A delay (1, e) caused by the wiring pattern resistances from the node number "0" to the leaf node named by the node number "e" will be approximately calculated based upon the following recursion formulae:

$$t(e, e) = 0$$
$$t(k/2, e) = t(k, e) + d(k/2, k) \quad k \geq 1$$
$$d(k/2, k) = w_1 \cdot r_x \cdot L_x(k/2, k) \cdot C(k) +$$
$$w_1 \cdot r_y \cdot L_y(k/2, k) \cdot C(k) +$$
$$w_1 \cdot \alpha_{xy} \cdot L_x(k/2, k) \cdot L_y(k/2, k) +$$
$$w_2 \cdot \alpha_{xx} \cdot L_x(k/2, k) \cdot L_x(k/2, k) +$$
$$w_2 \cdot \alpha_{yy} \cdot L_y(k/2, k) \cdot L_y(k/2, k)$$
$$C(e) = C_e$$
$$C(k) = C(2 \cdot k) + c_x \cdot L_x(k, 2 \cdot k) + c_y \cdot L_y(k, 2 \cdot k) +$$
$$C(2 \cdot k + 1) + c_x \cdot L_x(k, 2 \cdot k + 1) + c_y \cdot L_y(k, 2 \cdot k + 1)$$
$$\alpha_{xx} = r_x \cdot c_x$$
$$\alpha_{yy} = r_y \cdot c_y$$
$$\alpha_{xy} = 0.5 \cdot (r_x \cdot c_y + r_y \cdot c_x),$$

where symbol t(a, b) indicates a delay caused by the wiring pattern resistances from the node number "a" to the node number "b"; symbol "$C_e$" denotes an input terminal capacitance of the leaf node "e"; symbol C(a) represents a summation between the wiring pattern capacitances from the node number "a" to the down stream side thereof, and the input terminal capacitances of the leaf nodes; symbols "$r_x$", "$r_y$" are resistance values per a unit length of the wiring pattern along the X direction and the Y direction, respectively; symbols "$c_x$", "$c_y$" indicate capacitance values per a unit length of the wiring pattern along the X direction and the Y direction, respectively; and symbols "$L_x(k/2, k)$", $L_y(k/2, K)$ show lengths of the wiring patterns for connecting the parent node k/2 with the child node k along the X direction and the Y direction, respectively.

The essential points of these formulae exist in that the RC delays, caused when the load capacitances located down stream from the respective resistors are charged/discharged, are successively added, and also a good approximation for delay of the circuit is obtained by weighting RC products by "$w_2$" when the resistances and capacitances are distributed and by "$w_1$" when they are lumped.

A calculation is performed, assuming now that a length of a wiring pattern for connecting a parent node to a child node is equal to a "Manhattan distance", namely the shortest path, so that differences in delays caused by a folded shape is negligible. This is because the below-mentioned difference between the maximum delay and the minimum delay caused by the folded shape is practically very small, as compared with other terms in the definition formula d(k/2, k):

$$w_1 \cdot (r_x \cdot c_y - r_y \cdot c_x) \cdot L_x(k/2, k) \cdot L_y(k/2, k)$$

Figures 6A, 6B, 6C:
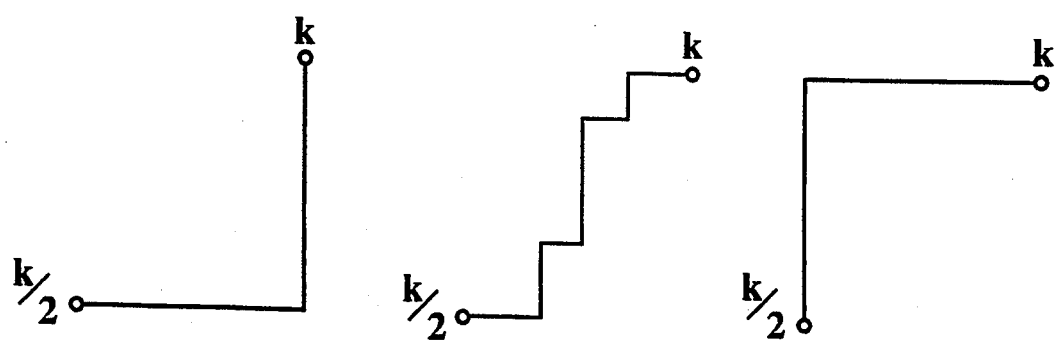
FIGS. 6A to 6C show route diagrams of wiring patterns having different bending forms according to the first preferred embodiment.

It should be noted that a center value in patterns (corresponding to patterns shown in FIGS. 6A and 6B) where the maximum delay and the minimum delay are produced, has been employed in the above formula.

Furthermore, assuming now that an internal delay and an ON-resistance of the root driver cell are "I" and "$R_o$", respectively, an entire delay t(−1, e) caused from the node number "−1" to the leaf node having the node number "e" is calculated as follows:

$$t(-1, e) = I + w_1 \cdot R_o \cdot C(0) + t(0, e)$$

$$C(0) = C(1) + c_x \cdot L_x(0, 1) + c_y \cdot L_y(0, 1)$$

A maximum delay value $T_L(K)$ and a minimum delay value $T_s(K)$ caused from the node "K" to the leaf node are obtained based upon the above formulae:

$$T_L(K) = \max(T_L(2 \cdot k) + d(k, 2 \cdot k),$$
$$T_L(2 \cdot k + 1) + d(k, 2 \cdot k + 1))$$

$$T_s(K) = \min(T_s(2 \cdot k) + d(k, 2 \cdot k),$$
$$T_s(2 \cdot k + 1) + d(k, 2 \cdot k + 1))$$

A clock skew S(k) with respect to the delays caused from the node "k" to the leaf node is expressed by:

$$S(k) = T_L(k) - T_s(k)$$

At points of the input terminal (node number "−1") of the root driver and the output terminal (node number "0") thereof, the following maximum delays, minimum delays, and clock skew are obtained:

$$T_s(0) = T_s(1) + d(0, 1) + w_1 \cdot R_o \cdot C(0)$$

$$T_L(0) = T_L(1) + d(0, 1) + w_1 \cdot R_o \cdot C(0)$$

$$T_s(-1) = T_s(0) + I$$

$$T_L(-1) = T_L(0) + I$$

$$S(-1) = S(0) = S(1) = T_L(1) - T_s(1)$$

It should be noted that with respect to the maximum delay value $T_L(e)$ and the minimum delay value $T_s(e)$ at the leaf node (e) in the sub-tree, the delays occurred in the sub-trees positioned lower than this leaf node "e" have been set.

As previously explained, the delay calculation model may be considered in accordance with this preferred embodiment of the present invention. Based upon this delay calculation model, a method for determining positions of branch points will now be described.

(2) Determining of Branch-Point Position within Sub-Tree

First, a description will now be made of such a method for determining a position of a node "k", namely a position of a branch point thereof under condition that the positions of the nodes appearing down stream from this node "k" have been determined, and also the clock skew can be minimized. It should also be noted that the position of this branch point is selected from a point positioned on a line segment of a straight line for connecting positions of two children nodes in order that unwanted delays caused by the detour wiring patterns are avoided and also simpler calculations should be established. The clock skew S(k) occurring at the node "k" is expressed by:

$$\begin{aligned} S(k) &= T_L(k) - T_s(k) \\ &= \max(S(2^*k), T_L(2^*k) + d(k, 2^*k) - T_s(2^*k^*1) - \\ &\quad d(k, 2^*k + 1), S(2^*k + 1), T_L(2^*k + 1) + \\ &\quad d(k, 2^*k + 1), - T_s(2^*k) - d(k, 2^*k)) \\ &= \max(S(2^*k), \mu(k) - \epsilon(k) + \sigma(k), \\ &\quad S(2^*k + 1), \mu(k) + \epsilon(k) - \sigma(k)) \\ &= \max(S(2^*k), S(2^*k + 1), \mu(k) + |\lambda(k)|), \end{aligned}$$

under the following definitions:

$$\sigma(k) = d(k, 2^*k) - d(k, 2^*k + 1)$$

$$\epsilon(k) = 0.5 * (T_L(2*k+1) + T_s(2*k+1) - T_s(2*k) - T_s(2*k))$$

$$\lambda(k) = \sigma(k) - \epsilon(k)$$

$$\mu(k) = 0.5 * (T_L(2*k+1) - T_s(2*k+1) + T_L(2*k) - T_s(2*k))$$
$$= 0.5 * (S(2*k+1) + S(2*k))$$

As a apparent from the precondition related to the process sequence, either "$\lambda(k)$" or "$\sigma(k)$" in this formula is changed by the position of the branch point for the node "k", and the remaining terms of this formula are previously known. As consequence, the term $|k(k)|$ should be minimized so as to minimize the above-described clock skew "$S(k)$".

Figure 7:
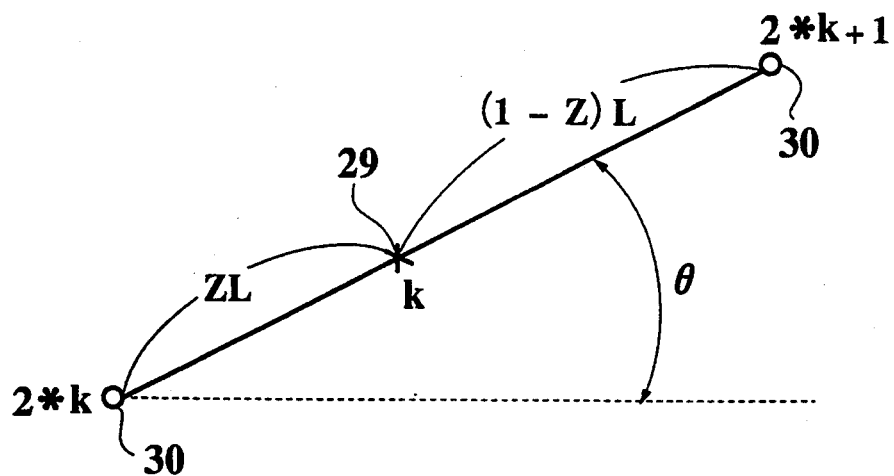
FIG. 7 is a conceptional diagram for explaining a method for determining branch points within a sub-tree according to the first preferred embodiment.

Assuming now that the position of this node "k" corresponds to a point ($0 \leq Z \leq 1$) where both of a node (2*k) and a node (2,k+1) are interior-divided into Z:(1−Z); an angle of a straight line for connecting these two children nodes, which intersects the x axis is "$\theta$"; and a straight distance "L" (see FIG. 7) between these two children nodes is defined by:

$$L = ((L_x(k, 2*k) + L_x(k, 2*k+1)^2 + (L_y(k, 2*k) + L_y(k, 2*k+1))^2)^{\frac{1}{2}}),$$

since it is given as follows:

$$L_x(k, 2*k) = L*Z*|\cos(\theta)|$$

$$L_y(k, 2*k) = L*Z*|\sin(\theta)|$$

$$L_x(k, 2*k+1) = L*(1-Z)*|\cos(\theta)|$$

$$L_y(k, 2*k+1) = L*(1-Z)*|\sin(\theta)|$$

if the following definition is made:

$$\beta_1 = w_1*(r_x*|\cos(\theta)| + r_y*|\sin(\theta)|)*L*(C(2*k) + C(2*k+1))$$

$$\beta_2 = (w_2*\alpha_{xx}*\cos^2(\theta) + w_2*\alpha_{yy}*\sin^2(\theta) + w_1*\alpha_{xy}*|\cos(\theta)|*|\sin(\theta)|)*2*L^2$$

$$\gamma = C(2*k+1)/(C(2*k) + C(2*k+1)) \quad 0 < \gamma 1$$

then, the terms "$\lambda(k)$" and "$\sigma(k)$" changed by the branch-point position of the node "k" are obtained as follows:

$$\sigma(k) = d(k, 2*k) - d(k, 2*k+1)$$
$$= w_1 * r_x * L * (Z * C(2*k) - (1 - Z) * C(2*k+1))$$
$$* |\cos(\theta)| + w_1 * r_y * L * (Z * C(2*k) - (1-Z)$$
$$* C(2*k+1)) * |\sin(\theta)| + w_1 * \sigma_{xy} * L^2 *$$
$$(2*Z - 1) * |\cos(\theta)| * |\sin(\theta)| + w_2 * \sigma_{xx} *$$
$$L^2 * (2*Z - 1) * \cos^2(\theta) + w_2 * \alpha_{yy} * L^2 *$$
$$(2*Z 31 1) * \sin^2(\theta)$$
$$= w_1 * L * (Z * (C(2*k) + C(2*k+1)) - C(2*k+1))$$
$$* (r_x * |\cos(\theta)| + r_y + |\sin(\theta)|) + L^2 * 2 *$$
$$(z - 0.5) * (w_1 * \alpha_{xy} * |\cos(\theta)| * |\sin(\theta)| + w_2$$
$$* \alpha_{xx} * \cos^2(\theta) + w_2 * \alpha_{yy} * \sin^2(\theta))$$
$$= \beta_1 * (Z - \gamma) + \beta_2 * (Z - 0.5)$$
$$\lambda(k) = (\beta_1 + \beta_2) * Z - (\beta_1 * \gamma + \beta_2 * 0.5) - \epsilon(k)$$

Since the term "$\lambda(k)$" corresponds to a linear function of Z, (namely, the parameter to determine the branch-point position) by which the term $|\lambda(k)|$ of the inequality $0 \leq Z \leq 1$ may be minimized, Z may be selected as follows:

If $-(\beta_1*\gamma + \beta_2*0.5) - \epsilon(k) > 0, Z = 0(\because$
$\lambda(k) \geq \lambda(k)_{z-0} > 0)$, (A)

If $\beta_1*(1-\gamma) + \beta_2*0.5 - \epsilon(k) < 0, Z = 1(\because$
$\lambda(k) \leq \lambda(k)_{z-1} < 0)$. (B)

Otherwise, if ($\lambda(k)_{z-0} \leq 0 \leq \lambda(k)_{z-1}$),
$Z = (\beta_1*\gamma + \beta_2*0.5 + \epsilon(k))/(\beta_1 + \beta_2)$. (C)

At this time, the clock skew at the node "k" is given in accordance with the respective cases:

$$S(k) = \max(S(2*k), S(2*k+1), \mu(k) + \lambda(k)_{z-0}) \quad (D)$$

$$S(k) = \max(S(2*k), S(2*k+1), \mu(k) - \lambda(k)_{z-1}) \quad (E)$$

$$S(k) = \max(S(2*k), S(2*k+1)) (\because \lambda(k) = 0, \max (S(2*k), S(2*k+1)) \geq \mu(k)) \quad (F)$$

As described above, the branch point can be determined at the position "k" which is interior-divided by the parameter "Z".

The above-described method is the detailed method for determining positions of branch points within the sub-trees. The major feature of this position determining method is such that the resultant clock skew may be extremely reduced. The reason is as follows: since $\beta_1$ and "$\beta_2$" are increased from two to four times every time the depth level of the tree is raised by 1 stage, if "$\epsilon(k)$" around the leaf node is relatively small, most of the nodes positioned at the depth levels of the respective trees are equal to the above-explained case (F). In other words, $\lambda(k) = 0$, and the clock skew at the root node is substantially equal to the clock skew occurring around the leaf node. In particular, if the clock skew occurring at the leaf node may be set to 0, then the clock skew occurring at the root skew may be similarly set to 0.

(3) Process for Entire Tree

Figure 8:
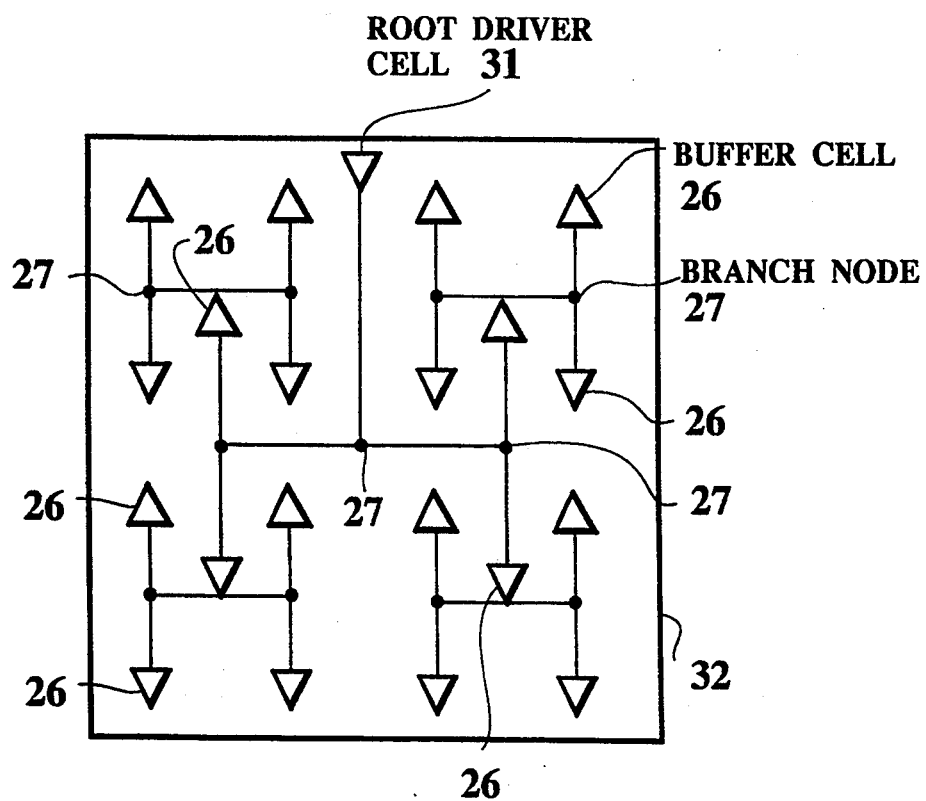
FIG. 8 schematically represents an example of a tree structure into which multi-staged buffer cells have been inserted, according to the first preferred embodiment.

Finally, a description will now be made of a method for determining a position of a branch point 27 in such a hierarchical binary tree into which a multi-staged buffer cell 26 has been inserted, according to the first preferred embodiment of the present invention, with reference to FIG. 8. This determining process corresponds to the process defined at the previous step 14 shown in FIG. 3, the flow chart of which is indicated in FIG. 4. For the sake of easy explanation, it is assumed in this hierarchical tree that a hierarchy of a tree driven by a root driven cell 31 is a first hierarchy; the subsequent hierarchies are successively numbered as a second hierarchy, a third hierarchy, and so on along a direction of a signal transmission; and a hierarchy of this tree in which the buffer cell 26 for directly driving the cluster is a leaf node is an m-th hierarchy.

Figure 4:
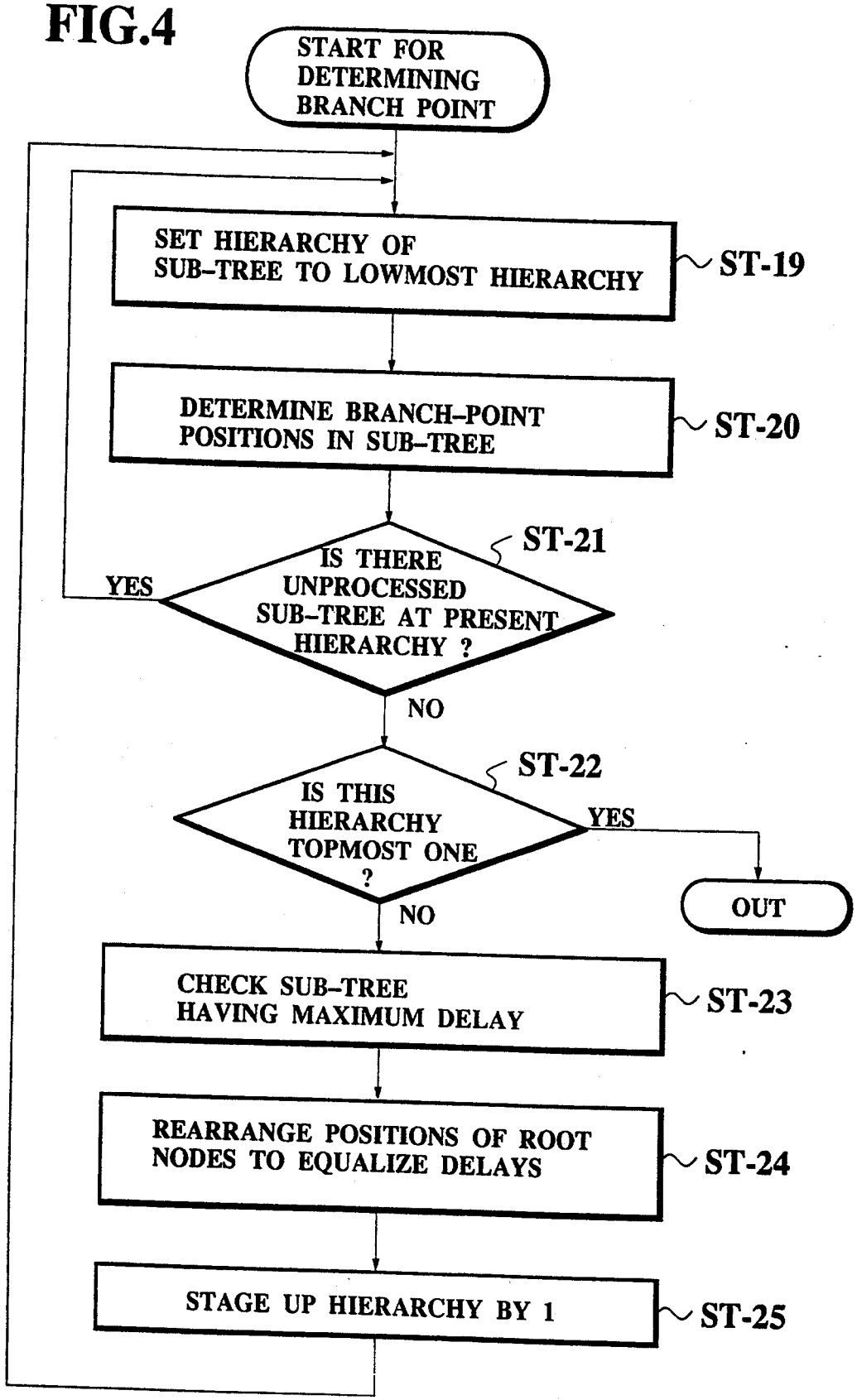
FIG. 4 is a flow chart for showing a process to determine branch points (junctions) within the binary tree according to the first preferred embodiment.

In a step ST-19 of the flow chart shown in FIG. 4, the hierarchy of the sub-tree to be processed is set to the lowmost hierarchy, namely the m-th hierarchy.

Figure 9:
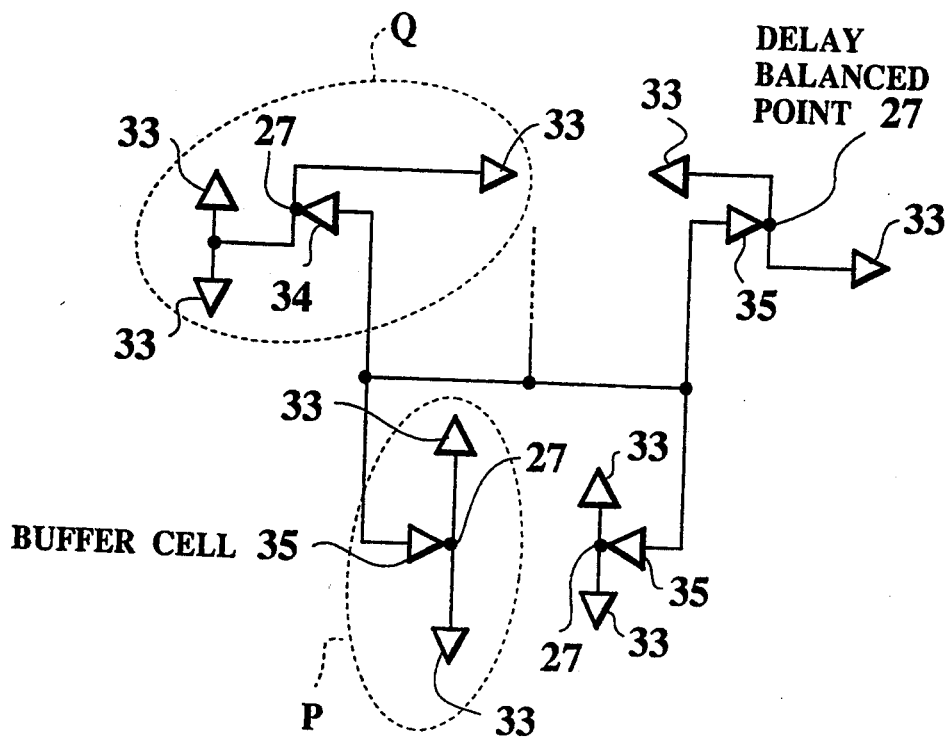
FIG. 9 is a schematic arrangement for representing an initial setting condition of buffer-cell arranging positions, according to the first preferred embodiment.

At a step ST-20, the above-described process operation to determine the branch-point position within the sub-tree is carried out with respect to a plurality of sub-trees at this m-th hierarchy. At this time, the positions of the buffer cells functioning as the route of the sub-trees are temporarily set to delay balanced points 27 which have been determined based upon the positions of the two children nodes on the sub-trees as shown in FIG. 9.

In a judgement process as defined at a step ST-21, a check is done whether or not the sub-tree which has not yet been processed is still left at this processing stage. If YES, then the previous process of the step ST-20 is repeated to this unprocessed sub-tree. If NO, then this determining process is advanced to a step ST-23.

At this step ST-23, investigation is performed for the sub-tree having the maximum delay value among the sub-trees at this hierarchy level by utilizing the above-described model, and this maximum delay value is derived.

Figure 10:
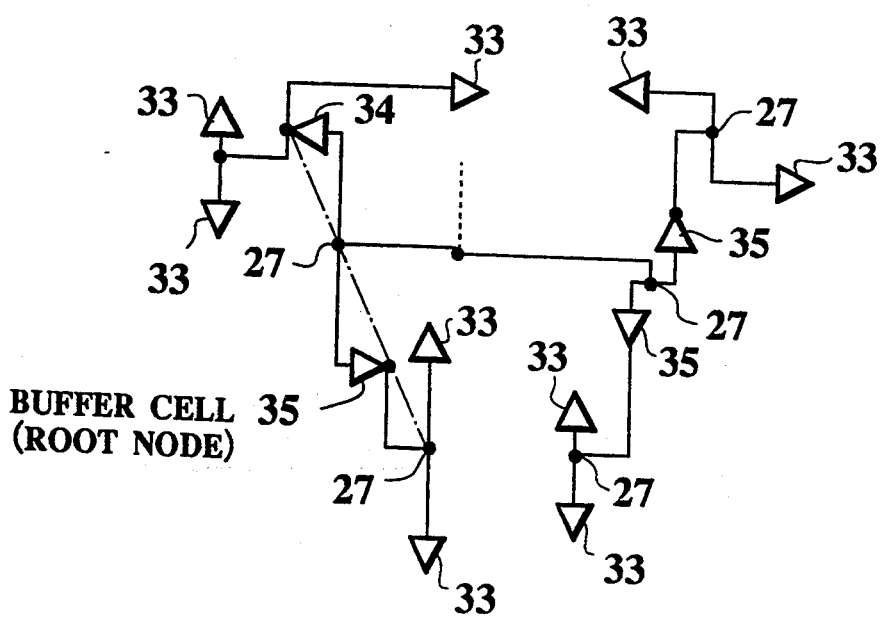
FIG. 10 is a schematic arrangement for showing a modified condition of buffer-cell arranging positions, according to the first preferred embodiment.

At the subsequent step ST-24, as represented in FIG. 10, in the sub-trees other than the above sub-tree having the maximum delay value, the buffer cells 35 corresponding to the root node are positionally shifted, whereby the delay values owned by the respective sub-trees are substantially equal to each other. This positional-shift direction corresponds to a direction along which the node to be positionally shifted approaches the position of the node having the brother/sister relationship with the former node.

At a step ST-25, after the hierarchy to be processed is stepped up by 1 stage, the determining process is returned to the process at the previous step ST-20. Then, the following determining process is repeated.

One concrete example of the step ST-24 among this determining process will now be described.

For instance, assuming now that a maximum delay value and a minimum delay value of a sub-tree "Q" which has the largest delay value in this hierarchy are $^{(Q)}T_L$ and $^{(Q)}T_s$, respectively; a maximum delay value and a minimum delay value of a sub-tree "P" to be processed are $^{(P)}T_L$ and $^{(P)}T_s$, respectively; on a straight line segment (indicated by a dot/dash line shown in FIG. 10) for connecting the position 27 of the root node 34 of the sub-tree having the brother/sister relationship with the above sub-tree "P" and the position 27 of the root node 35 of this sub-tree "P" (namely, the above-described delay balanced point 27), a point ($0 \leq Z \leq 1$) where this line segment is interior-divided under $Z:(1-Z)$ is selected to be a newly determined position for this buffer cell 35; an angle for intersecting this straight line with the X axis is "$\theta$"; and a straight distance between the root nodes is "L", an amount "$\delta$" of increased delays caused by such a positional shift of the buffer cells is calculated as follows:

$$\begin{aligned}
\delta &= w_1 * (r_x * |\cos(\theta)| + r_y * |\sin(\theta)|) * L * Z * \\
&\quad {}^{(P)}C_{(o)} + L^2 * Z^2 * (w_1 * a_{xy} * |\cos(\theta)| * \\
&\quad |\sin(\theta)| + w_2 * a_{xx} * \cos^2(\theta) + w_2 * a_{yy} * \\
&\quad \sin^2(\theta)) + w_1 * R_o * (C_x * |\cos(\theta)| + C_y * \\
&\quad |\sin(\theta)|) * L * Z \\
&= \zeta_1 * Z + \zeta_2 * Z^2
\end{aligned}$$

Then, in order that the delay value of the sub-tree "P" is coincident with the delay value of the sub-tree "Q", it is sufficient that the below-mentioned difference between central values of these delays is equal to the above-described increased delay amount "$\delta$":

$$\tau = 0.5 * (^{(Q)}T_L + {}^{(Q)}T_s - {}^{(P)}T_L - {}^{(P)}T_s)$$

Accordingly, the positional shift may be determined in such a way that a positive value is obtained from a solution of the following equation:

$$\zeta_2 * Z^2 + \zeta_1 * Z - \tau = 0, \text{ namely,}$$

$$Z = (-\zeta_1 + \sqrt{\zeta_1^2 + 4 * \zeta_2 * \tau})/(2.0 * \zeta_2),$$

where symbols "$\zeta_1$" and "$\tau_2$" indicate:

$$\zeta_1 = w_1 * L * ((r_x * |\cos(\theta)| + r_y * |\sin(\theta)|) * {}^{(P)}C(0) + (c_x * |\cos(\theta)| + c_y + |\sin(\theta)|) * R_0)$$

$$\zeta_2 = L^2 * (w_1 * a_{xy} * |\cos(\theta)| * |\sin(\theta)| + w_2 * a_{xx} * \cos^2(\theta) + w_2 a_{yy} * \sin^2(\theta))$$

Under such circumstances, the central values of the delay amounts caused in the respective sub-trees at this hierarchy can become equal to each other. As a consequence, the maximum clock skew value of the sub-trees at this hierarchy is equal to the maximum clock skew value of the entire sub-tree below this hierarchy level. It should be understood that these maximum/minimum delay values at this hierarchy are set as initial allay values for the leaf node in the sub-tree positioned above this hierarchy by 1 hierarchy level.

Second Process to Distribute Clock Signal

To shorter the processing time required to determine the optimum clock signal distribution, the following clock-signal distributing method may be considered as a second preferred embodiment of the present invention.

That is, in the above-described first clock-signal distributing method, the position into which the buffer cells are inserted while maintaining the minimum delay value has been checked by employing the step-by-step method. Instead of this step-by-step method, a clock-signal distributing method capable of further reducing the processing time thereof is proposed as the second clock-signal distributing method. Precisely speaking, in accordance with the first preferred embodiment, when, for instance, the stage number of the buffer cells to be inserted is selected to be an "i"-stage; the sort of used buffer cells is equal to a "j"-sort; and a depth (position) in a tree into which these buffer cells can be inserted is equal to a "k"-level, there are ($j^1 \times {}_kC_1$) combinations consisting of the different cell-insertion portions. Therefore, the processing steps required in the first clock-signal distribution method become ($j^1 \times {}_kC_1$).

However, according to the second clock-signal distributing method, a total processing step thereof may be considerably reduced, as compared with the first clock-signal distributing method.

Generally speaking, is a depth of a sub-tree driven by a root driver cell is increased, or becomes deeper (lower level), a capacitance of a wiring pattern is exponentially increased, so that a delay is similarly increased. As a consequence, it is preferable to introduce an upper limit value with respect to the depth of the driven sub-tree in order to minimize such a delay. That is, assuming now that these maximum values are "l", a total number of combinations to be processed becomes $(jl)^1$, or smaller, based upon the above total number of ($j^1 \times {}_kC_1$), which constitutes the major feature of this second distributing method. As a consequence, it is preferable to introduce an upper limit value with respect to the depth of the driven sub-tree in order to minimize such a delay. That is, assuming now that these maximum values are "l", a total number of combinations to be processed becomes $(jl)^1$, or smaller, based upon the above total number of ($j^1 \times {}_kC_1$), which constitutes the major feature of this second distributing method. A description will now be made of a delay estimation method to set such an upper limit value; a method for setting the upper limit value; and a modified process flow.

Delay Estimation to Obtain Upper Limit Value of Tree Depth

First, the delay estimation to obtain the upper limit value of the depth for the sub-tree will now be explained.

As is known, a delay is changed in accordance with a shape of a wiring pattern. However, in this preferred embodiment, a complete symmetric path is considered in order to obtain a typical delay value, it is assumed in this complete symmetric path that an H-shaped path is recursively repeated, and an arranging position of either a buffer cell, or a root driven cell is set to a center of this H-shaped path. At this time, a delay "$t_n$" occurred in the sub-tree directly driven by either the buffer cell or the root driven cell may be calculated by the following formula (1):

$$T_n = I + w_1 R_o C_1 +$$

$$\sum_{k=1}^{n} \left( rc\left(\frac{1}{8} w_1 + \frac{1}{16} \times 2w_2\right)(D \cdot 2^{1-k})^2 + w_1 r\left(\frac{1}{4} \times 2 + \frac{1}{4}\right)D \cdot 2^{1-k} \cdot C_{k+1} \right)$$

$$C_k = 4C_{k+1} + \frac{3}{2} cD \cdot 2^{1-k}, \quad (1)$$

where symbols are defined as follows:
I: internal delay within buffer cell, or root driver cell,
r: resistance value of wiring pattern per a unit length thereof,
c: load capacitance value of wiring pattern per a unit length thereof,
D: length of one side of sub-tree region,
n: depth of sub-tree (i.e., repetition number of H-shaped path), and
$C_k$: load capacitance of partial tree at down stream from k-th (staged) H-shaped path.
It is also assumed that both of the wire resistance value and the wiring load capacitance value are substantially equal to each other (averaged value) along the X and Y directions, and also a shape of the sub-tree region is rectangular.

Based upon the approximation formula of the load capacitance "$C_k$", it is given:

$$C_k + \frac{3}{2} cD2^{1-k} = 4\left(C_{k+1} + \frac{3}{2} cD \cdot 2^{1-(k+1)}\right)$$

$$= 4^{n+1-k}\left(C_{n+1} + \frac{3}{2} cD \cdot 2^{-n}\right)$$

Here, assuming now that a load capacitance "$C_{n+1}$" of the leaf node is set to "$C_g$", this load capacitance "$C_k$" is expressed by:

$$C_k = \left(C_g + \frac{3}{2} cD \cdot 2^{-n}\right) \cdot 4^{n+1-k} - 3cD \cdot 2^{-k}$$

When this load capacitance "$C_k$" is applied to the above formula (1), the delay "$t_n$" is calculated as follows:

$$t_n =$$

$$I + w_1 R_o \left\{ \left(C_g \cdot 4^n + \frac{3}{2} cD(2^n - 1)\right) + \sum_{k=1}^{n}\left[\frac{1}{2} rc(w_1 + w_2)D^2 4^{-k} + \frac{3}{2} w_1 rD\left(C_g + \frac{3}{2} cD2^{-n}\right)4^n \cdot 8^{-k} - \frac{3}{2} cD \cdot 4^{-k}\right] \right\}$$

$$= I + w_1 R_o \left\{ C_g \cdot 4^n + \frac{3}{2} cD(2^n - 1) \right\} +$$

$$\frac{3}{14} w_1 r D C_g (4^n - 2^{-n}) + rcD^2 \frac{9}{28} w_1(2^n - 4^{-n}) - \frac{3}{4} w_1(1 - 4^{-n}) + \frac{w_1 + w_2}{6}(1 - 4^{-n}) \right\}$$

Furthermore, if the following approximation is introduced:
$w_2 \approx \frac{1}{2} w_1$; $1 - 8^{-n} \approx 1$; $1 - 4^{-n} \approx 1$, the approximate delay "$t_n$" is calculated by the following formula (2):

$$t_n \approx I + w_1\left(R_o + \frac{3}{14} rD\right)\left(\frac{3}{2} cD \cdot 2^n + C_g \cdot 4^n\right) - \frac{3}{2} w_1\left(R_o + \frac{1}{3} rD\right)cD. \quad (2)$$

Subsequently, a difference in delays caused when the buffer cells are inserted and also are not inserted, will now be conducted with employment of the above formula (2).

Assuming now that a depth of a sub-tree driven by a buffer cell or a root drive cell of interest is selected to be "$n_1$", and another depth of another sub-tree driven by a buffer cell subsequent to the former buffer cell is selected to be "$n_2$", a difference "$\Delta t$" between a delay caused by inserted the former and latter buffer cells and a delay caused by inserting only the former buffer cell is given by:

$$\Delta t = {}^{(1)}t_{n_1+n_2} - ({}^{(1)}t_{n_1} + {}^{(2)}t_{n_2}) = 2^{n_2} w_1 \left\{ \left({}^{(1)}R_o + \frac{3}{14} rD \frac{3}{2} cD2^{n_1}\right) - \left({}^{(2)}R_o + \frac{3}{14} rD2^{-n_1}\right)\frac{3}{2} cD2^{-n_1} \right\} + \quad (3)$$

-continued $$4^{n_2} \cdot w_1 \left\{ \left( {}^{(1)}R_o + \frac{3}{14} rD \right) C_g \cdot 4^{n_1} - \left( {}^{(2)}R_o + \frac{3}{14} rD2^{-n_1} \right) C_g \right\} - w_1 \left( {}^{(1)}R_o + \frac{3}{14} rD \right) \left( \frac{3}{2} cD2^{n_1} + C_g 4^{n_1} \right) -$$

$$ {}^{(2)}I + w_1 \left( {}^{(2)}R_o + \frac{1}{3} rD2^{-n_1} \right) \frac{3}{2} rD2^{-n_1} > w_1 \left( {}^{(1)}R_o + \frac{3}{14} rD \right) \left( \frac{3}{2} cD \cdot 2^{n_1} + 3C_g 4^{n_1} \right) -$$

$$w_1 \left( {}^{(2)}R_o + \frac{3}{28} rD \right) \left( \frac{3}{2} cD + 4C_g \right) - {}^{(2)}I.$$

It should be noted that a suffix with a blank attached to a left shoulder of a variable indicates a stage of a buffer cell.

Then, if the right hand of the above-described inequality (3) is set to $f(n_1)$, a solution "$n_1*$" which can satisfy the following inequality (4) becomes a desirable upper limit value for the depth of the sub-tree driven by the buffer cell of interest:

$$f(n_1*-1) \leq 0 \leq f(n_1*) \quad (4).$$

This is because in case of $n_1 \geq n_1*$, it is given by:

$$\Delta t > f(n_1) \geq f(n_1*) \geq 0.$$

In other words, it may be understood that the resultant delay value can be always minimized if the latter buffer cell is inserted, irrelevant to "$n_2$".

As described above, the desirable upper limit value "$n_1*$" at the depth of the sub-tree driven by the buffer cells may be calculated when the stage number of the driving buffer cell, the internal delays, and the dimension of the sub-tree region.

Figure 3:
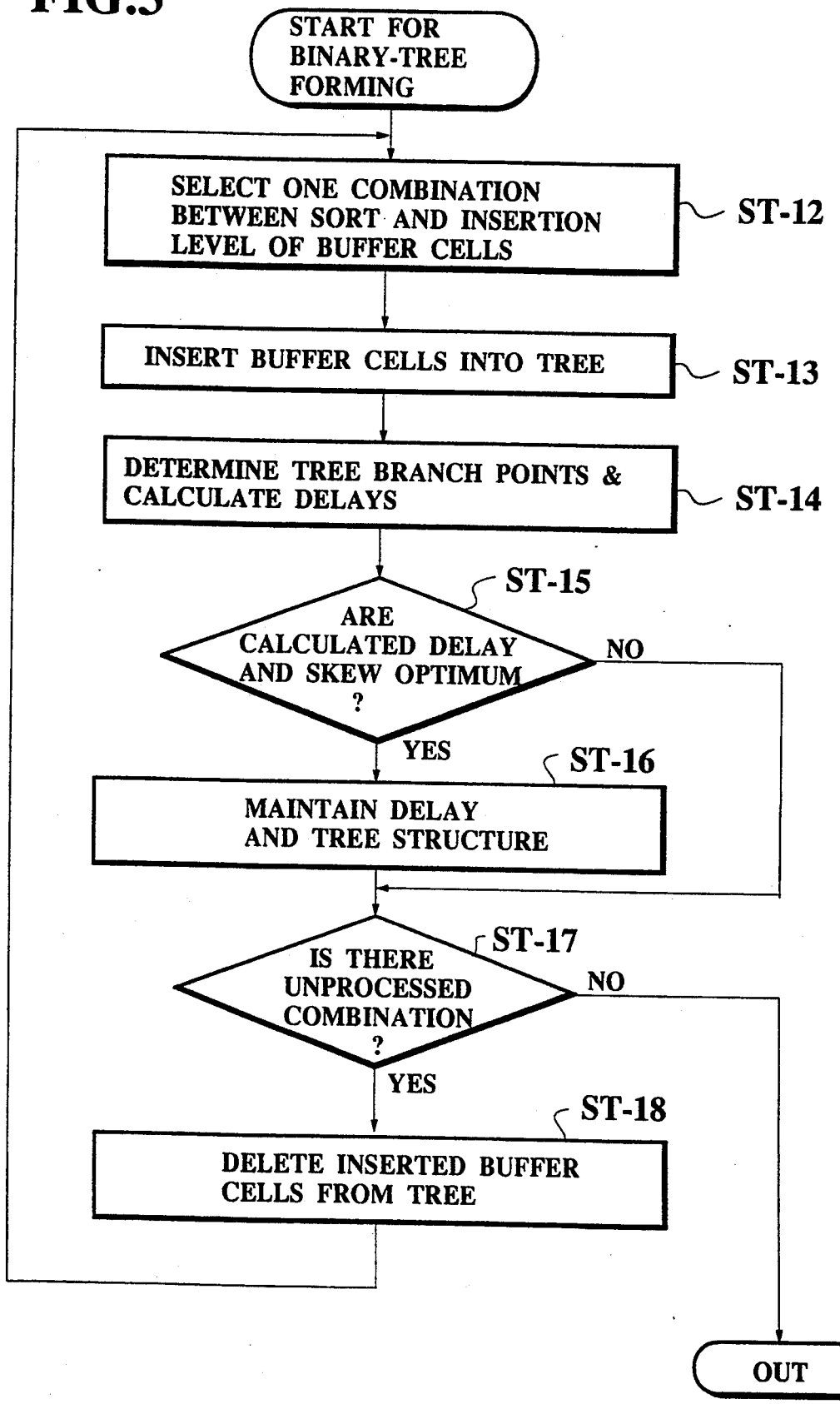
FIG. 3 is a flow chart for representing a binary-tree forming process according to the first preferred embodiment.

The overall process flow of the second clock-signal distributing method is substantially same as that of the first clock-signal distributing method as defined in the flow chart shown in FIG. 3.

Figure 11:
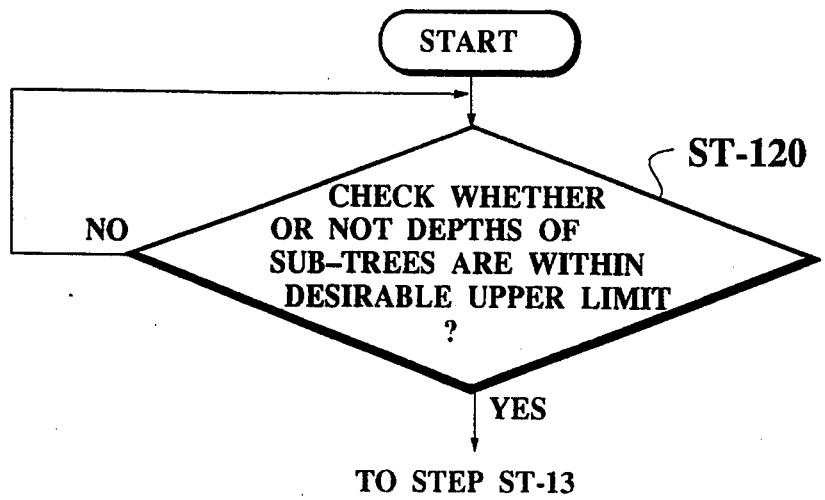
FIG. 11 is a flow chart for explaining a second clock-signal distributing method of the present invention.

A modified process of the second distributing method is represented as a step ST-120 in FIG. 11, instead of the previous step ST-12. At this step ST-120, a check is made whether or not the depths of th sub-trees are within the above-defined desirable upper limit value "$n_1*$" with respect to the combination of sorts and insertion levels for the respective buffer cell stages. Then, only such combinations whose sub-tree depths are within this desirable upper limit value "$n_1*$" are selected, which will be processed by the process operations after the step ST-13 (see FIG. 3). As a consequence, since the unnecessary process to determine paths of wiring patterns can be omitted, the entire processing time can be considerably reduced, as compared with that of the first clock-signal distributing method.

Third Process to Distribute Clock Signal

As the precondition of the above-described second clock-signal distributing method, the stage number of the buffer cells to be inserted has been previously designated. Alternatively, an optimum stage number of buffer cells to be inserted may be obtained in accordance with a third clock-signal distributing method of the present invention.

To this end, a maximum value "l" of upper limit values for depths of sub-trees driven by each sort of buffer cells is first calculated, and thereafter a minimum value "$N_I$" for stage numbers of buffer cells to be inserted is calculated based upon this maximum value "l".

Assuming now that a depth of an entire tree is selected to be "h", this minimum value "$N_I$" is given by:

$$N_I = h/l$$

Figure 12:
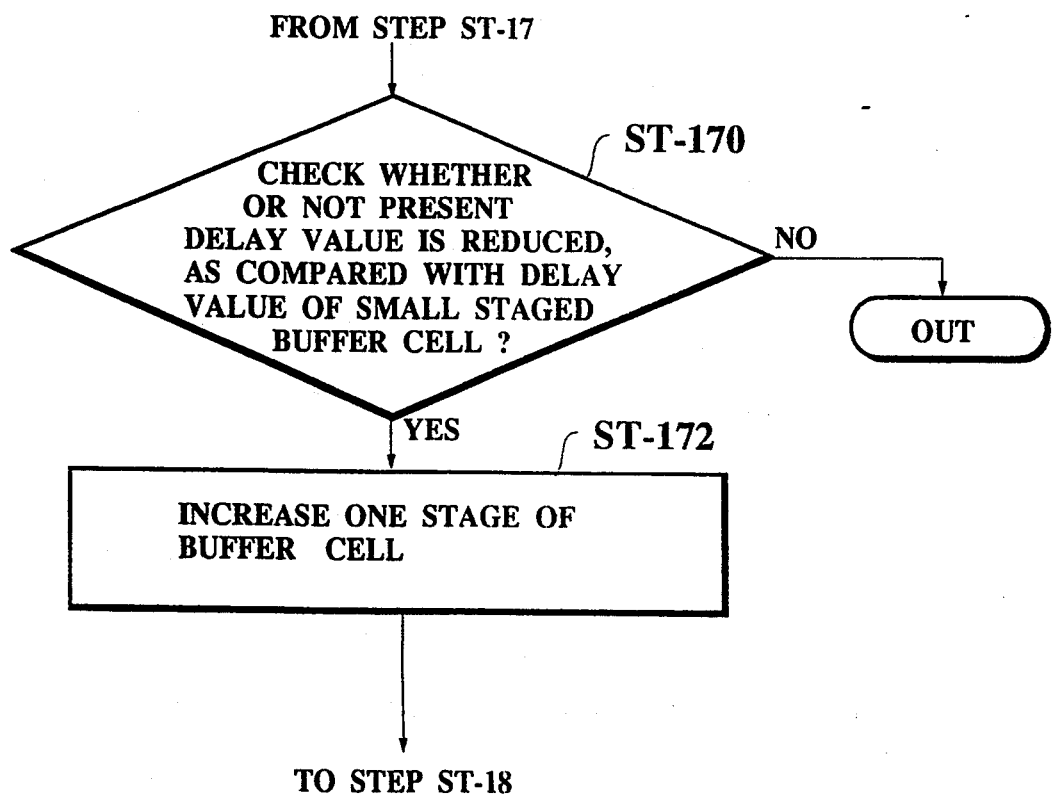
FIG. 12 is a flow chart for explaining a third clock-signal distributing method of the present invention.

This calculation is executed at the step ST-1 of FIG. 2. Then, this third determining process operation is carried out in accordance with the same flow operation as defined in FIGS. 2 and 3 except the following steps. That is, as shown in FIG. 12, after the judgement process defined at the step ST-17 of FIG. 3, another check is done whether or not the present delay value is reduced, as compared with a delay value caused when the stage number of buffer cells to be inserted is reduced by 1 stage at a step ST-170.

If the present delay value is reduced (YES), then one stage of the buffer cell to be inserted is increased at a step ST-172. Then, the subsequent process operation is repeated as shown in FIG. 3. To the contrary, if the present delay value is not reduced (NO), then this process is accomplished (OUT). In accordance with the above-described third process operation, the optimum stage number of the buffer cells to be inserted having the minimum delay value can be calculated in addition to such a merit of the shorter processing time, as described in the second processing operation. Namely, the desirable stage number of buffer cells to be inserted is not investigated by the step-by-step method, but can be checked from the intermediate stage "$N_I$", resulting in a shorter processing time.

Forth Process to Distribute Clock Signal

As previously described, according to the first preferred embodiment of the present invention, if the clock signal delays produced in all of the clusters are identical to each other, the clock skew in the entire binary tree may be limited to near zero as small as possible. Even if there is certain fluctuation in the delays occurring in the clusters, when the above-described process is performed under such conditions that the initial delay of the leaf node in the m-th hierarchical sub-tree is selected to be "0", the clock skew of the circuit portions other than the clusters may be limited to near zero. As a consequence, the overall clock skew may be suppressed approximately to the maximum clock skew in the clusters.

Figures 13A, 13B, 13C:
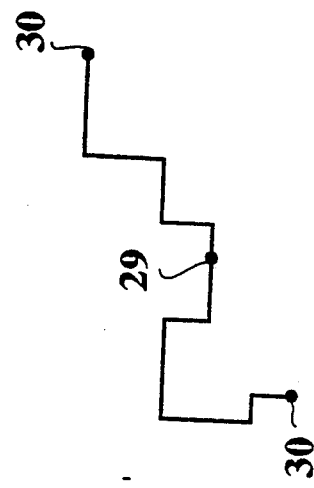
FIGS. 13A to 13C illustrate how to move and correct the position of the branch point within the sub-tree according to a fourth preferred embodiment of the present invention.

It should be noted that to achieve the clock skew limited to the near zero, the following two conditions should be considered. First, an actual wiring pattern between branch points should be formed as the shortest wiring path therebetween, and secondly, a finally arranged position of a buffer cell should be located at the closest position to the position as defined at the step 24 of FIG. 4. However, there are actually some possibilities that the delay balance is slightly disturbed due to the following reasons. That is, for instance, even when the branch point has been first determined as shown in FIG. 13A, an actual wiring pattern path becomes such a detour path which is not equal to the shortest path, as represented in FIG. 13B, due to presence of a region for prohibiting formation of a wiring-pattern (not shown in detail).

Figures 14A, 14B, 14C:
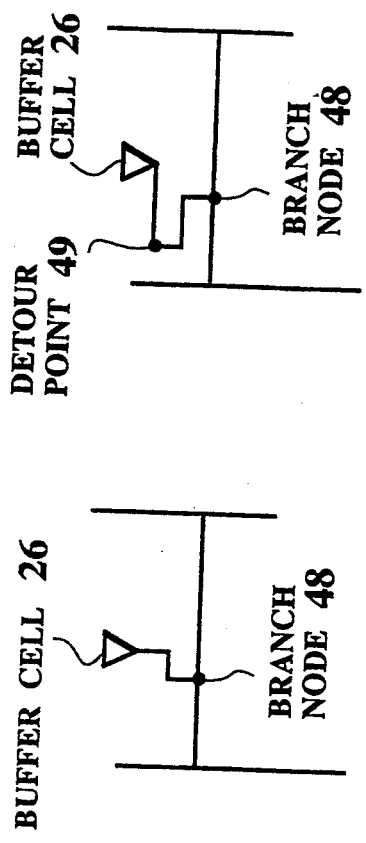
FIGS. 14A to 14C represent an example of the detour path positioned near the buffer cell according to the fourth preferred embodiment.

Also, as indicated in FIG. 14A, even if a buffer cell 26 is once positioned, this buffer cell is finally positioned as shown in FIG. 14B in order to avoid overlapping of this buffer cell 26 with other cells (not shown in detail). As a consequence, there exists a small delay unbalance.

To suppress or reduce such a small delay unbalance condition, there are two effective solutions. First, as illustrated in FIG. 13C, the position of the branch point is corrected based on the actual wiring pattern path. Secondly, a detour path near the buffer cell 26 is formed as shown in FIG. 14C.

Fourth Process Flow

A process flow according to the fourth preferred embodiment will now be described with reference to a flow chart of FIG. 15.

As apparent from the flow chart of FIG. 2, this fourth flow chart is established by improving the process operation (namely, the wiring paths among the nodes are determined) defined at the step ST-10 of FIG. 2, so that the final clock skew may be furthermore lowered, as compared with the clock skew of the previous preferred embodiments. It should be noted that since the important process operations of the fourth process flow shown in FIG. 15 are defined at steps ST-39, 40 and 46, the remaining process operations are simply explained in the following description.

Figure 15:
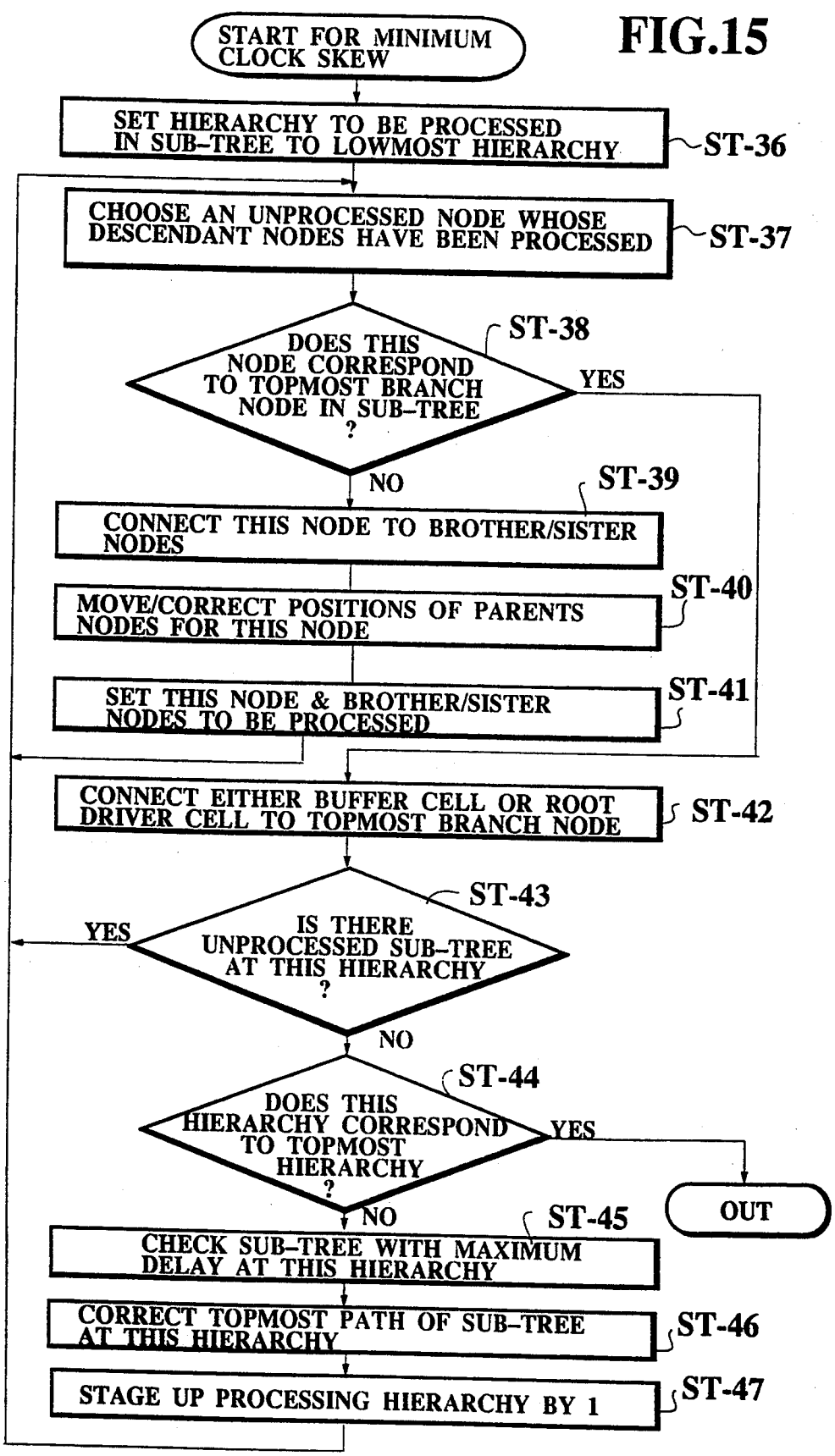
FIG. 15 is a flow chart for explaining a process operation to determine a precise wiring pattern path according to the fourth preferred embodiment.

At a first step ST-36 of this flow chart shown in FIG. 15, a hierarchy of a sub-tree to be processed is set to the lowmost hierarchy. Then, unprocessed nodes are derived from the nodes provided within this sub-tree. The unprocessed nodes have no mark which implies that these nodes have been processed at a step ST-41 (will be described later), and also children nodes below the unprocessed nodes have been processed.

At a next step ST-38, a check is made whether or not the derived node corresponds to the topmost branch node of this sub-tree. If YES, then the process operation jumps over the subsequent steps ST-39 to 41 and reaches a step ST-42. To the contrary, if NO, then the process operation is advanced to a next step ST-39.

At this step ST-39, both of this node and brother/sister nodes having the same parents nodes with this node are derived and are connected with each other.

Subsequently, the positions of the parent nodes for the relevant node is positionally shifted/corrected to such a point where RC (resistance/capacitance) delays produced after the parents nodes are balanced, namely, clock skew thereof becomes minimum. In a concrete example, an intermediate point in the wiring pattern path between the children nodes is used as an initial value, and RC delays occurring at the respective sides of the children nodes are calculated. Then, the final point with minimal clock skew is obtained in such a binary search along the wiring pattern path for connecting the two children nodes.

At a next step ST-41, both of this node and the brother/sister nodes are marked as the "processed nodes", and thereafter the process operation is returned to the previous step ST-37.

On the other hand, at the above-described step ST-42, an output terminal of a buffer cell, or a root driver cell which directly drives this sub-tree, is connected to the topmost branch node of the sub-tree, so that the wiring patterns are completely formed within the entire sub-tree.

Another check is made at a step ST-43 whether or not there is an unprocessed sub-tree positioned at the same hierarchy as the above-described hierarchy. If YES, namely the unprocessed sub-tree is present, then this unprocessed sub-tree is processed by the process operations as defined at the steps ST-37 to 42. If NO, then the process operation is advanced to a step ST-44.

A further check is done at this step ST-44 whether or not this hierarchy corresponds to the topmost hierarchy. If YES, then this process operation of FIG. 15 is ended (out). Conversely, if NO, then the process operation is still continued and therefore advanced to a step ST-45.

At the step ST-45, sub-tree "Q" having a maximum delay value is investigated from the sub-trees positioned at this hierarchy, and this maximum delay value is derived.

At the subsequent step ST-46, with respect to the sub-trees "P" other than the sub-tree "Q" with the maximum delay value, the wiring-pattern paths formed at the previous step ST-42 are once ripped up, and thereafter a detour wiring pattern path is formed in such a manner that the sub-trees "P" own the same delay value as the maximum delay value as illustrated in FIG. 12C (will be discussed more in detail).

At a further step ST-47, after the hierarchy to be processed is raised up by 1 hierarchy, the process operation is returned to the previous step ST-37 so that the process operations after this step ST-37 will be executed.

Returning back to the step ST-46, a detour point 49 is set on the wiring-pattern path for connecting the output terminal of the buffer cell 26 and the topmost branch node 48 of the sub-trees "P". Then, this detour point 49 is connected via one shortest path to the output terminal of this buffer cell 26, and also this detour point 49 is connected via the other shortmost path to the topmost branch node.

Determining of Detour Point

Figure 16:
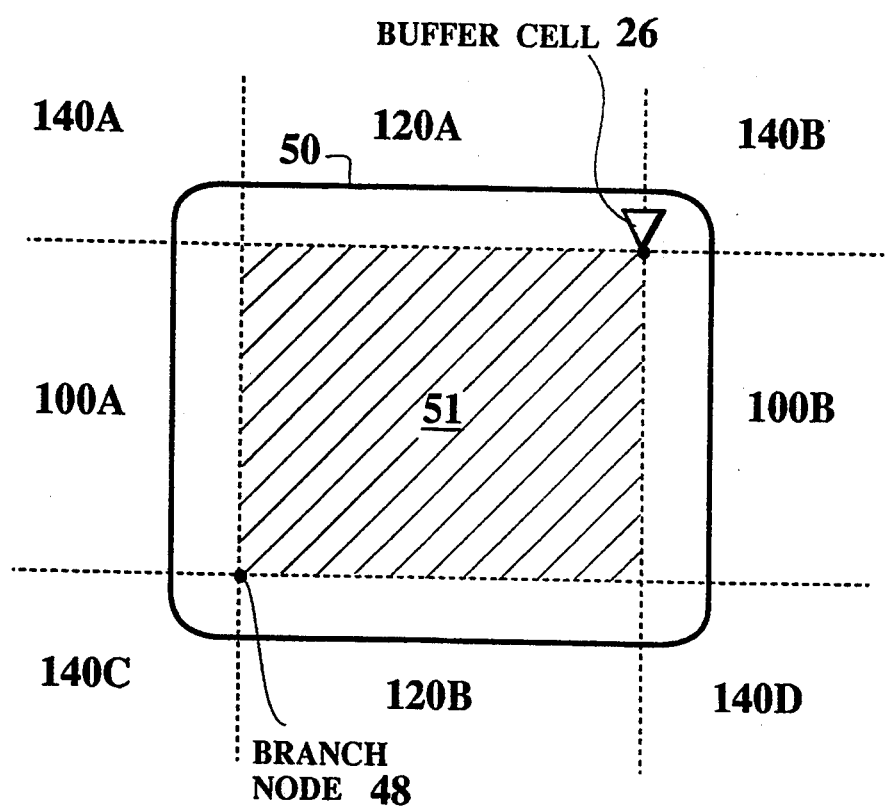
FIG. 16 represents how to determine the detour points in the detour wiring pattern path according to the fourth preferred embodiment.

A detour point may be determined in accordance with the fourth preferred embodiment as follows. As shown in FIG. 16, the detour point is defined with respect to a rectangular region 51 (hatched region of FIG. 16) with two diagonal points (namely, the output terminal of the buffer cell 26 and the topmost branch node 48 of the sub-tree "P"), and two regions 100A, 100B positioned along the horizontal direction of this rectangular region 51, two regions 120A and 120B positioned along the vertical direction thereof, and furthermore four regions 140A to 140D positioned along the diagonal directions thereof.

In case of detour points set in the horizontal regions 100A and 100B, assuming now that the detour points are set to positions apart from the rectangular region 51 along the horizontal direction, a total path length is extended by $2*\Delta x$ due to the detour pattern, so that an amount of increased delay "$\delta$" is expressed by the following equation (5):

$$\delta = w_1 * r_x * 2 * \Delta x *^{(p)} C(0) + w_2 + a_{xx} * (2 * \Delta x)^2 + w_1 * R_o * c_x * 2 * \Delta x \tag{5}$$

-continued
$$= \zeta_{1a} * \Delta x + \zeta_{2a} * (\Delta x)^2.$$

Accordingly, to minimize a difference between this delay amount "δ" and the delay of the sub-tree "Q", a positive solution of equation: δ=τ, namely Δx is set as follows:

$$\Delta x = (-\zeta_{1a} + \sqrt{\zeta^2_{1a} + 4 * \zeta_{2a} * \tau})/(2 * \zeta_{2a}). \quad (6)$$

It should be noted in this calculation of the delay amount "δ" that errors caused by the extended patterns, depending upon the locations on the path, are negligible, and also symbols used in the above-described equation (5) have the same, or similar meanings for the previous symbols.

Similarly, when detour points are set in the vertical regions 120A and 120B, assuming now that these detour points are set to positions apart from the rectangular region 51 by a distance "Δy" along the vertical direction, an amount of increase delay "δ" is given by the following equation (7):

$$\begin{aligned}
\delta &= w_1 * r_y * 2 * \Delta y *{}^{(P)}C(0) + w_2 + a_{yy} * (2 * \Delta y)^2 + \\
&\quad w_1 * R_o * c_y * 2 * \Delta y \\
&= \zeta_{1b} * \Delta y + \zeta_{2b} * (\Delta y)^2 \\
&= \tau.
\end{aligned} \quad (7)$$

a positive solution of equation δ=τ is set as follows;

$$\Delta y = (-\zeta_{1b} + \sqrt{\zeta^2_{1b} + 4 * \zeta_{2b} * \tau})/(2 * \zeta_{2b}). \quad (8)$$

Furthermore, when detour points are set to the diagonal regions 140A to 140B, assuming now that these detour points are located at positions separated from the closet vertexes of the rectangular region 51 by a horizontal distance of "Δx" and a vertical distance of "Δy", the following equation (9) should be satisfied:

$$\begin{aligned}
\delta &= w_1 * 2 * (r_x * \Delta x + r_y * \Delta y) *{}^{(P)}C(0) + \\
&\quad w_1 * a_{xy} * 4 * \Delta x * \Delta y + \\
&\quad w_2 * 4 * (a_{xx} * (\Delta x)^2 + a_{yy} * (\Delta y)^2) + \\
&\quad w_1 * R_o * 2 * (c_x * \Delta x + c_y * \Delta y) \\
&= \zeta_{1a} * \Delta x + \zeta_{2a} * (\Delta x)^2 + \\
&\quad \zeta_{1b} * \Delta y + \zeta_{2b} * (\Delta y)^2 + \zeta_3 * \Delta x * \Delta y \\
&= \tau.
\end{aligned} \quad (9)$$

A locus of points which can satisfy this equation (9) corresponds to a portion of an ellipse.

In a summary, a set of detour points settable in these regions 100A to 140D around the rectangular region 51 becomes a curved line 50 indicated by a solid line of FIG. 16. When an arbitrary one point of this curved line 50 is selected for rearranging the wiring patterns, the clock skew can be minimized.

As previously described in detail, in accordance with the fourth preferred embodiment, the clock skew may be minimized in conformity with the final-staged cell arrangement as well as the actual wiring pattern paths.

Fifth Process to Distribute Clock Signal

As previously stated in connection with the first preferred embodiment, even when the branch point has been once determined as shown in FIG. 13A, the actual wiring pattern path does not correspond, or does not form the shortest wiring pattern path (see FIG. 13B). This is because there are cells through which wiring patterns are not permitted to pass, on the shortest wiring path of FIG. 13A. FIG. 17 represents one example of cell arrangements located near wiring pattern paths.

Figure 17A:
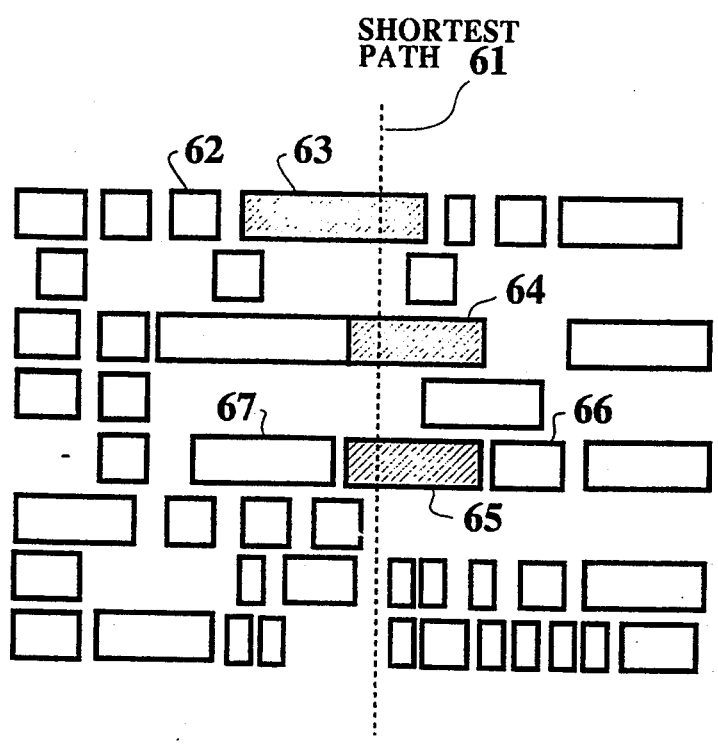
FIGS. 17A to 17D pictorially show cell arrangements according to a fifth preferred embodiment of the present invention.
Figure 17B:
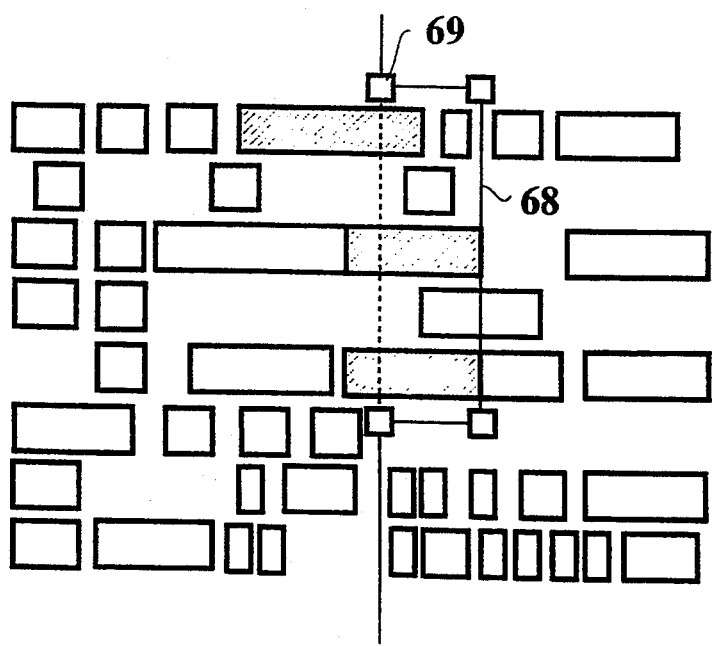

Assuming now that, as shown in FIG. 17A, there are cells (hatched portions) 63 to 65 through which the wiring pattern is not permitted to pass, at a portion through which the shortest wiring pattern path 61 will pass, a detailed wiring path becomes a "folded shape" as represented in FIGS. 17B and 13B in order to escape from these cells 63 to 65. As a consequence, since a through hole 69 is formed, a total length of this provisional path is increased as compared with the shortest wiring pattern path 61, so that the clock skew thereof becomes large. To solve this problem, a method for distributing a clock signal has been proposed in accordance with the fifth preferred embodiment of the present invention.

Figure 17C:
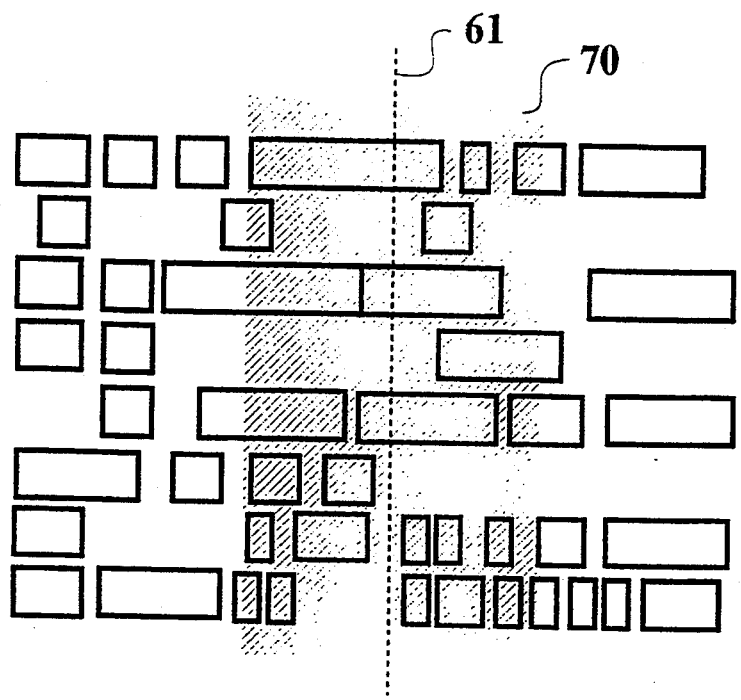

That is, at the above-described steps ST-8 and ST-10 of the flow chart shown in FIG. 2, the arrangement of the cells 63 to 65 is modified in such a manner that no cells 63 to 65 through which a wiring pattern path is not allowed to pass, are present under this wiring pattern path within a region 70 adjacent to the wiring pattern path 61, as represented in FIG. 17C.

Figure 17D:
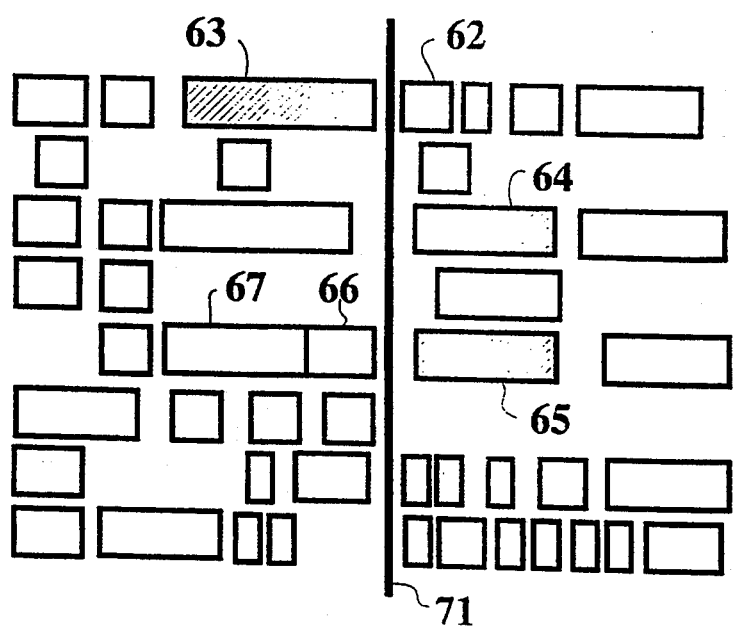

As apparent from FIG. 17A, the above-described cells 62 to 67 correspond to such cells to be rearranged. The rearranged cells are illustrated in FIG. 17D. Cells 62 to 67 shown in FIG. 17D correspond to the above-described cells 62 to 67 of FIG. 17A. Accordingly, an optimum wiring pattern path 71 may be determined, as indicated in FIG. 17D, without the folded path and the through hole 69.

As previously described in detail, according to the present invention, there are particular advantages that the branch points used to obtain, the equidelay time may be determined within each of the sub-trees at the respective hierarchical levels, and also the differences in the delay times produced over the hierarchical levels may be balanced by adjusting the positions of the buffer cells and also by additionally employing the detour wiring patterns around these cells. As a consequence, the clock signal can be distributed within a digital logic integrated circuit at high precision and with minimum clock skew, as well as the entire delay thereof can be minimized. Moreover, such a wiring pattern path without any folded shaped and through hole can be determined by modifying, or rearranging the positions of the cells through which the final wiring pattern path is prohibited to pass.

What is claimed is:

1. A method for distributing a clock signal in a wiring-pattern network formed on a semiconductor substrate where said clock signal is supplied from a root driver cell via repeating buffer cells to a plurality of terminal cells, comprising the steps of:

grouping said plurality of terminal cells into a plurality of clusters containing at least one of said terminal cells;

forming a binary-tree-shaped wiring pattern path where said root driver cell is constituted as a root node and said clusters are constituted as leaf nodes;

inserting said repeating buffer cells as branch nodes into portions of the binary-tree-shaped wiring pattern path at which each of delay times of said clock signal propagating therein is minimized and dividing the binary-tree-shaped wiring pattern path into multi-stage hierarchical sub-trees;

calculating first delay times appearing from each of said branch nodes to each of said leaf nodes, said calculating step being successively repeated from said leaf nodes upward to said root node via said branch nodes;

setting physical positions of said branch nodes on the semiconductor substrate where a difference among said first delay times becomes minimum;

separating said terminal cells from each other which are overlapped with each other on said binary-tree-shaped wiring pattern path by updating previous entire information about a circuit connection when said repeating buffer cells are inserted, and by correcting arrangement information about positions of the terminal cells adjacent to said repeating buffer cells;

determining a final wiring-pattern path within each of said clusters based upon said correcting arrangement information;

calculating second delay times occurring in each of the clusters based on the final wiring-pattern path;

determining positions of each of said branch nodes based on said second delay times; and determining a final wiring-pattern path among each of said branch nodes.

2. A clock-signal distributing method as claimed in claim 1, wherein said first delay times are defined by resistance values and capacitance values of a signal path from each of said branch nodes of said binary-tree-shaped wiring pattern path to said each of said leaf nodes.

3. A semiconductor integrated circuit produced through said method claimed in claim 1.

4. A clock-signal distributing method as claimed in claim 1, wherein said buffer-cell inserting portions are initially set to positions of the highest one of said branch nodes of said multi-stage hierarchical sub-trees; thereafter each of said set positions is modified to a position where downstream delay time therefrom is equal to the largest delay time of one of said repeating buffer cells, which has been inserted into the same stage of said multi-stage hierarchical sub-trees on said binary-tree-shaped wiring pattern path; and a direction of modification of said position is that of approaching a repeating buffer cell in a brother/sister relationship with said repeating buffer cell to be modified.

5. A clock-signal distributing method as claimed in claim 4, wherein a calculation is performed to obtain a maximum upper limit value from a plurality of upper limit values of a tree-depth of said multi-stage hierarchical sub-trees which are driven by available sorts of said repeating buffer cells, and thereafter a minimum stage number of said repeating buffer cells to be inserted is calculated based on said maximum upper limit value.

6. A clock-signal distributing method as claimed in claim 1, wherein, at a depth of each one of said sub-trees driven by one of said repeating buffer cells, judging whether or not an estimated delay time of a clock-signal propagation from said depth downward to any one of end positions is shortened by inserting another repeating buffer cell at a downward position of said depth and, in the case of being shortened, inserting said other repeating buffer cell into a position where a delay time of said clock-signal propagating through the binary-tree-shaped wiring pattern path is minimized.

7. A clock-signal distributing method as claimed in claim 1, wherein said final wiring-pattern path determining step includes the steps of:

connecting one of said branch nodes as a parent node on said binary-tree-shaped wiring pattern path to one of the branch nodes as child nodes;

rearranging a position of said parent node with regard to said two child nodes to a position on the final wiring-pattern path that a first difference of delay from said parent node to each of said leaf nodes descendant from said parent node becomes minimum;

determining an other final wiring-pattern path up to the topmost branch node within one of said multi-stage hierarchical sub-trees by repeating said rearranging step from a side of said each of said descendant leaf nodes upward to said topmost branch node;

forming a detour path portion within the other final wiring-pattern path from the topmost branch node of said one of said multi-stage hierarchical sub-trees to said root node where a second difference between the delay times in signal propagation along a downstream direction of said one of the multi-stage hierarchial sub-trees, becomes minimum; and rearranging said final wiring-pattern path over the entire semiconductor substrate by repeating said determining step of said other final wiring-pattern path within one of said multi-stage hierarchical sub-trees from another one of said multi-stage hierarchical sub-trees located at the low hierarchical level to the topmost branch node.

8. A clock-signal distributing method as claimed in claim 1, wherein while determining said final wiring-pattern path, a position of a cell through which said final wiring-pattern path is not permitted to pass is modified to a position where said final wiring-pattern path is permitted to pass.

9. A clock-signal distributing method as claimed in claim 1, wherein at least a portion of the binary-tree-shaped wiring pattern path used to distribute the clock signal, except for a portion of the binary-tree-shaped wiring pattern path formed within said clusters is formed with employment of a wiring-pattern layer specific to the clock signal, having a wire resistance value and a wire lead capacitance smaller than those of said binary-tree-shaped wiring pattern path formed within said clusters.

10. A clock-signal distributing method as claimed in claim 1, wherein said physical positions of said branch nodes on the semiconductor substrate are determined to be positioned where a first sum consisting of a first delay time from one of said branch nodes as a parent node to one of said two branch nodes as one child node adjacent downward to said parent node plus a second delay time from said one child node to one of the lowermost leaf nodes which is descendant of said one child node is equal to a second sum consisting of a third delay time from said parent node to an other one of said two branch nodes as an other child node adjacent downward to said parent node plus a fourth delay time from said other child node to an other one of the lowermost leaf nodes which is a descendant of said other child node.

11. A method for distributing a clock signal in a wiring-pattern network formed on a semiconductor substrate wherein said clock signal is supplied from a driver cell to a plurality of terminal cells; comprising the steps of:

forming a binary-tree-shaped wiring pattern path connecting between said root driver cell and said terminal cells wherein said root driver cell is constituted as a root node and said terminal cells are constituted as leaf nodes;

determining a position of one branch node which is connected at a downward side with children nodes constituted with said leaf nodes and other branch nodes having their positions previously determined to a portion where a difference between delay times each of which is taken for said clock signal propagating from said one branch node downward to a descendant leaf node in said leaf nodes is minimized; and repeating said determining step for said position of said one branch node initially started from the adjacent position to said leaf nodes successively upward to said root node.

12. A semiconductor integrated circuit produced through said method claimed in claim 11.

* * * * *